(12) United States Patent
Terasaki et al.

(10) Patent No.: US 11,393,738 B2
(45) Date of Patent: Jul. 19, 2022

(54) BONDED BODY, POWER MODULE SUBSTRATE, POWER MODULE, METHOD FOR MANUFACTURING BONDED BODY, AND METHOD FOR MANUFACTURING POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 812 days.

(21) Appl. No.: 16/070,339

(22) PCT Filed: Jan. 20, 2017

(86) PCT No.: PCT/JP2017/001922
§ 371 (c)(1),
(2) Date: Aug. 28, 2018

(87) PCT Pub. No.: WO2017/126653
PCT Pub. Date: Jul. 27, 2017

(65) Prior Publication Data
US 2021/0043540 A1    Feb. 11, 2021

(30) Foreign Application Priority Data

Jan. 22, 2016   (JP) .................................. 2016-010676
Jan. 5, 2017    (JP) .............................. JP2017-000417

(51) Int. Cl.
*H01L 21/48*    (2006.01)
*H01L 23/373*   (2006.01)

(52) U.S. Cl.
CPC ...... *H01L 23/3735* (2013.01); *H01L 21/4882* (2013.01)

(58) Field of Classification Search
None
See application file for complete search history.

(56) References Cited

U.S. PATENT DOCUMENTS 5,354,415 A * 10/1994 Fushii ..................... H05K 3/06
                                                         216/108
6,033,787 A *  3/2000 Nagase .................. B32B 15/04
                                                         428/545

(Continued)

FOREIGN PATENT DOCUMENTS

JP    2008-181940 A    8/2008
JP    4375730 B2       12/2009

(Continued)

OTHER PUBLICATIONS

Supplementary European Search Report dated Jul. 19, 2019, issued for Europena Patent Application No. 17741530.4.

(Continued)

*Primary Examiner* — Abul Kalam
(74) *Attorney, Agent, or Firm* — Locke Lord LLP; James E. Armstrong, IV; Nicholas J. DiCeglie, Jr.

(57) ABSTRACT

A bonded body of the present invention includes a ceramic member formed of ceramics and a Cu member formed of Cu or a Cu alloy. In a bonding layer formed between the ceramic member and the Cu member, an area ratio of a $Cu_3P$ phase in a region extending by up to 50 μm toward the Cu member side from a bonding surface of the ceramic member is equal to or lower than 15%.

5 Claims, 9 Drawing Sheets

(56) References Cited

U.S. PATENT DOCUMENTS

| | | | | |
|---|---|---|---|---|
| 6,221,511 B1* | 4/2001 | Sakuraba | ............ | B23K 35/3006 |
| | | | | 228/122.1 |
| 7,143,929 B2* | 12/2006 | Furukuwa | ............ | H01L 23/3735 |
| | | | | 228/246 |
| 9,504,144 B2* | 11/2016 | Terasaki | ................ | G01N 23/203 |
| 9,941,235 B2* | 4/2018 | Nishimoto | ................ | H05K 3/26 |
| 2012/0015152 A1* | 1/2012 | Takahashi | ............. | C04B 41/009 |
| | | | | 428/172 |
| 2014/0126155 A1* | 5/2014 | Imamura | .................... | C22C 5/08 |
| | | | | 361/715 |
| 2015/0208496 A1* | 7/2015 | Terasaki | ............. | H05K 13/0465 |
| | | | | 361/760 |
| 2016/0187080 A1 | 6/2016 | Remsburg | | |

FOREIGN PATENT DOCUMENTS

| | | |
|---|---|---|
| JP | 2015-043392 A | 3/2015 |
| JP | 2015-043393 A | 3/2015 |
| JP | 2015-065423 A | 4/2015 |

OTHER PUBLICATIONS

International Search Report dated Apr. 4, 2017, issued for PCT/JP2017/001922 and English translation thereof.
Notice of Allowance issued in European Patent Application No. EP 17741530.4, dated Nov. 29, 2021.

\* cited by examiner

BONDED BODY, POWER MODULE SUBSTRATE, POWER MODULE, METHOD FOR MANUFACTURING BONDED BODY, AND METHOD FOR MANUFACTURING POWER MODULE SUBSTRATE

TECHNICAL FIELD

The present invention relates to a bonded body in which a ceramic member and a Cu member are bonded to each other, a power module substrate in which a Cu foil formed of Cu or a Cu alloy is bonded to a ceramic substrate, a power module including the power module substrate, a method for manufacturing a bonded body, and a method for manufacturing a power module substrate.

Priorities are claimed on Japanese Patent Application No. 2016-010676 filed on Jan. 22, 2016 and Japanese Patent Application No. 2017-000417 filed on Jan. 5, 2017, the contents of which are incorporated herein.

BACKGROUND ART

A semiconductor device such as LED or a power module has a structure in which a semiconductor element is bonded to the top of a circuit layer formed of a conductive material.

A power semiconductor element for high power control that is used for controlling wind power generation, an electric vehicle such as an electromobile, and the like generates a large amount of heat. Accordingly, as a substrate on which such an element is mounted, a power module substrate obtained by bonding a metal sheet as a circuit layer having excellent conductivity to one surface of a ceramic substrate formed of, for example, aluminum nitride (AlN) has been widely used in the related art. Furthermore, sometimes a metal sheet is bonded as a metal layer to the other surface of the ceramic substrate.

For example, a power module substrate described in PTL 1 has a structure in which a circuit layer is formed by bonding a Cu foil (Cu member) to one surface of a ceramic substrate (ceramic member). In the power module substrate, the Cu foil is disposed on one surface of the ceramic substrate through a Cu—Mg—Ti brazing material interposed therebetween, and a heat treatment is performed to bond the Cu foil.

Incidentally, in a case where the ceramic substrate and the Cu foil are bonded to each other through the Cu—Mg—Ti brazing material as disclosed in PTL 1, an intermetallic compound containing Cu, Mg, or Ti is formed in the vicinity of the ceramic substrate.

The intermetallic compound formed in the vicinity of the ceramic substrate is hard. Therefore, in a case where a thermal cycle is loaded on the power module substrate, a high thermal stress is caused in the ceramic substrate. Accordingly, unfortunately, the ceramic substrate easily cracks.

In addition, in a case where the hard intermetallic compound is formed in the vicinity of the ceramic substrate at the time of bonding the ceramic substrate and the circuit layer to each other, a bonding rate between the ceramic substrate and the circuit layer may be reduced, and the ceramic substrate and the circuit layer may not be able to be excellently bonded to each other.

Therefore, for example, PTLs 2 to 4 suggest a power module substrate in which a ceramic substrate and a circuit layer are bonded to each other by using a Cu—P-based brazing material and an active element.

In the inventions described in PTLs 2 to 4, by the reaction between P in the Cu—P-based brazing material and the active element, a Cu layer is formed on the ceramic substrate side, and a hard intermetallic compound layer is not provided in the vicinity of the ceramic substrate. Therefore, the thermal stress caused in the ceramic substrate in a case where a thermal cycle is loaded can be reduced, and the occurrence of cracking in the ceramic substrate can be inhibited.

CITATION LIST

Patent Literature

[PTL 1] Japanese Patent No. 4375730
[PTL 2] Japanese Unexamined Patent Application, First Publication No. 2015-043392
[PTL 3] Japanese Unexamined Patent Application, First Publication No. 2015-065423
[PTL 4] Japanese Unexamined Patent Application, First Publication No. 2015-043393

SUMMARY OF INVENTION

Technical Problem

By the way, in recent years, the heat-generating temperature of the semiconductor element mounted on the power module substrate has tended to be increased. Therefore, on the power module substrate on which the semiconductor element is mounted, a thermal cycle reaching a temperature higher than that in the related art (for example, a temperature equal to or higher than 200° C.) is loaded.

In the power module substrate in which the ceramic substrate and the Cu foil are bonded to each other by using the Cu—P-based brazing material as described in PTLs 2 to 4, in a case where the thermal cycle reaching a high temperature is loaded, unfortunately, partial discharge easily occurs.

The present invention has been made in consideration of the circumstances described above, and an object thereof is to provide a bonded body in which a ceramic member and a Cu member are excellently bonded to each other and which makes it possible to inhibit the occurrence of partial discharge even in a case where a thermal cycle reaching a relatively high temperature is loaded, a power module substrate formed of the bonded body, a power module, a method for manufacturing the bonded body, and a method for manufacturing a power module substrate.

Solution to Problem

In order to achieve the aforementioned object, the inventors of the present invention conducted intensive examinations. As a result, the inventors obtained knowledge that in a power module substrate in which a ceramic substrate and a Cu foil are bonded to each other by using a Cu—P-based brazing material, sometimes a brittle $Cu_3P$ phase is formed in a bonding layer formed between the ceramic substrate and the Cu foil, and in a case where a thermal cycle reaching a relatively high temperature is loaded, the cracking occurs in the weak $Cu_3P$ phase, voids are formed, and as a result, partial discharge easily occurs. Furthermore, the inventors obtained knowledge that in a case where the thermal cycle is loaded, cracking occurs in the $Cu_3P$ phase, voids are formed between the $Cu_3P$ phase and the Cu—Sn layer in the bonding layer, and as a result, partial discharge easily occurs. In a case where the Cu—P-based brazing material containing Sn is used, P contained in the Cu—P-based brazing material reacts with other elements (for example, Ti of a Ti material) and is consumed. The Cu—Sn layer is a layer formed by this reaction.

The present invention has been made based on the knowledge described above. According to an aspect of the present invention, there is provided a bonded body including a ceramic member formed of ceramics and a Cu member formed of Cu or a Cu alloy, in which in a bonding layer formed between the ceramic member and the Cu member, an area ratio of a $Cu_3P$ phase in a region extending by up to 50 μm toward the Cu member side from a bonding surface of the ceramic member is equal to or lower than 15%.

According to the bonded body as the aspect of the present invention, in a bonding layer formed between the ceramic member and the Cu member, an area ratio of a $Cu_3P$ phase in a region extending by up to 50 μm toward the Cu member side from a bonding surface of the ceramic member is limited to be equal to or lower than 15%. Therefore, even in a case where a thermal cycle reaching a relatively high temperature is loaded, it is possible to inhibit the occurrence of partial discharge resulting from the $Cu_3P$ phase.

According to another aspect of the present invention, there is provided a power module substrate which is the aforementioned bonded body, the power module substrate including a ceramic substrate formed of the ceramic member, and a circuit layer which is formed on one surface of the ceramic substrate and formed of the Cu member, in which in a bonding layer formed between the ceramic substrate and the circuit layer, an area ratio of a $Cu_3P$ phase in a region extending by up to 50 μm toward the circuit layer side from a bonding surface of the ceramic substrate is equal to or lower than 15%.

According to the power module substrate as the aspect of the present invention, in a bonding layer formed between the ceramic substrate and the circuit layer, an area ratio of a $Cu_3P$ phase in a region extending by up to 50 μm toward the circuit layer side from a bonding surface of the ceramic substrate is equal to or lower than 15%. Therefore, even in a case where a thermal cycle reaching a relatively high temperature is loaded, it is possible to partial discharge from occurring on the circuit layer side due to the $Cu_3P$ phase, and the power module substrate has high reliability.

In the power module substrate as the aspect of the present invention, a metal layer formed of Al or an Al alloy may be formed on the other surface of the ceramic substrate.

In this case, because the metal layer formed of Al or an Al alloy having a relatively low deformation resistance is formed on the other surface of the ceramic substrate, in a case where a stress is applied to the power module substrate, the metal layer is deformed first. Therefore, it is possible to reduce the stress exerted to the ceramic substrate and to inhibit the breaking of the ceramic substrate.

In addition, according to still another aspect of the present invention, there is provided a power module substrate which is the aforementioned bonded body, the power module substrate including a ceramic substrate formed of the ceramic member, a circuit layer formed on one surface of the ceramic substrate, and a metal layer which is formed on the other surface of the ceramic substrate and formed of the Cu member, in which in a bonding layer formed between the ceramic substrate and the metal layer, an area ratio of a $Cu_3P$ phase in a region extending by up to 50 μm toward the metal layer side from a bonding surface of the ceramic substrate is equal to or lower than 15%.

According to the power module substrate as the aspect of the present invention, in a bonding layer formed between the ceramic substrate and the metal layer, an area ratio of a $Cu_3P$ phase in a region extending by up to 50 μm toward the metal layer side from a bonding surface of the ceramic substrate is equal to or lower than 15%. Therefore, even in a case where a thermal cycle reaching a relatively high temperature is loaded, it is possible to inhibit partial discharge from occurring on the metal layer side due to the $Cu_3P$ phase.

According to still another aspect of the present invention, there is provided a power module including the aforementioned power module substrate and a semiconductor element mounted on the circuit layer of the power module substrate.

The power module constituted as above includes the power module substrate in which the occurrence of partial discharge is inhibited. Therefore, even though the power module is used in an environment in which a thermal cycle reaching a relatively high temperature is loaded, the power module has high reliability.

According to still another aspect of the present invention, there is provided a method for manufacturing a bonded body including a ceramic member formed of ceramics and a Cu member formed of Cu or a Cu alloy. The method includes a laminating step of laminating the ceramic member and the Cu member through a Cu—P-based brazing material and a Ti material, and a heat treatment step of performing heating at a temperature equal to or higher than a melting start temperature of the Cu—P-based brazing material so as to generate a liquid phase, in which in the laminating step, the Cu—P-based brazing material and the Ti material are disposed such that an atomic ratio [Ti/P] of Ti to P interposed between the ceramic member and the Cu member falls into a range equal to or higher than 0.1 and equal to or lower than 0.8, and in the heat treatment step, a heating rate is within a range equal to or higher than 5° C./min and equal to or lower than 30° C./min.

According to the method for manufacturing a bonded body constituted as above, in the laminating step of laminating the ceramic member and the Cu member through a Cu—P-based brazing material and a Ti material, the Cu—P-based brazing material and the Ti material are disposed such that an atomic ratio [Ti/P] of Ti to P interposed between the ceramic member and the Cu member falls into a range equal to or higher than 0.1 and equal to or lower than 0.8. Therefore, the amount of Ti reacting with P is secured, and the formation of a $Cu_3P$ phase can be inhibited. In a case where the atomic ratio [Ti/P] of Ti to P is less than 0.1, the amount of Ti reacting with P is reduced. Accordingly, the generation of a $Cu_3P$ phase cannot be inhibited. Furthermore, in a case where the atomic ratio [Ti/P] of Ti to P is higher than 0.8, a large amount of Ti is melted into a liquid phase of the brazing material generated at the time of heating. Accordingly, the melting point of the liquid phase increases, and solidification easily proceeds. As a result, P which has not reacted with Ti remains, and many $Cu_3P$ phases are formed.

Furthermore, in the heat treatment step of performing heating at a temperature equal to or higher than a melting start temperature of the Cu—P-based brazing material so as to generate a liquid phase, a heating rate is equal to or higher than 5° C./min. Therefore, Ti is inhibited from being consumed by reacting with elements other than P, and P reacts with Ti. Accordingly, the formation of a $Cu_3P$ phase can be inhibited. In addition, because the heating rate in the heat treatment step is equal to or lower than 30° C./min, Ti is not unnecessarily rapidly diffused into the liquid phase, and the liquid phase is not easily solidified. Accordingly, the generation of a $Cu_3P$ phase can be inhibited.

According to still another aspect of the present invention, there is provided a method for manufacturing a power module substrate in which a circuit layer formed of Cu or a Cu alloy is provided on one surface of a ceramic substrate. The method includes bonding the ceramic substrate and the circuit layer to each other by the aforementioned method for manufacturing a bonded body.

According to the method for manufacturing a power module substrate constituted as above, the formation of a brittle $Cu_3P$ phase between the ceramic substrate and the circuit layer is inhibited. Therefore, a power module substrate can be manufactured which makes it possible to inhibit the occurrence of partial discharge even in a case where a thermal cycle reaching a relatively high temperature is loaded.

According to still another aspect of the present invention, there is provided a method for manufacturing a power module substrate in which a circuit layer is provided on one surface of a ceramic substrate and a metal layer formed of Cu or a Cu alloy is provided on the other surface of the ceramic substrate. The method includes bonding the ceramic substrate and the metal layer to each other by the aforementioned method for manufacturing a bonded body.

According to the method for manufacturing a power module substrate constituted as above, the formation of a $Cu_3P$ phase between the ceramic substrate and the metal layer is inhibited. Therefore, a power module substrate can be manufactured which makes it possible to inhibit the occurrence of partial discharge even in a case where a thermal cycle reaching a relatively high temperature is loaded.

According to still another aspect of the present invention, there is provided a method for manufacturing a power module substrate in which a circuit layer formed of Cu or a Cu alloy is provided on one surface of a ceramic substrate and a metal layer formed of Al or an Al alloy is provided on the other surface of the ceramic substrate. The method includes bonding the ceramic substrate and the circuit layer to each other by the aforementioned method for manufacturing a bonded body.

According to the method for manufacturing a power module substrate constituted as above, the formation of a brittle $Cu_3P$ phase between the ceramic substrate and the circuit layer is inhibited. Therefore, a power module substrate can be manufactured which makes it possible to inhibit partial discharge from occurring on the circuit layer side due to a $Cu_3P$ phase even in a case where a thermal cycle reaching a relatively high temperature is loaded.

Furthermore, because the circuit layer formed of Cu or a Cu alloy and the ceramic substrate can be bonded to each other at a relatively low temperature, it is possible to simultaneously bond the circuit layer formed of Cu or a Cu alloy, the ceramic substrate, and the metal layer formed of Al or an Al alloy to each other.

Advantageous Effects of Invention

According to the present invention, it is possible to provide a bonded body, in which a ceramic member and a Cu member are excellently bonded to each other and which makes it possible to inhibit the occurrence of partial discharge even in a case where a thermal cycle reaching a relatively high temperature is loaded, a power module substrate formed of the bonded body, a power module, a method for manufacturing the bonded body, and a method for manufacturing a power module substrate.

DESCRIPTION OF EMBODIMENTS

First Embodiment

Hereinafter, embodiments of the present invention will be described with reference to the attached drawings. First, a first embodiment of the present invention will be described.

Figure 1:
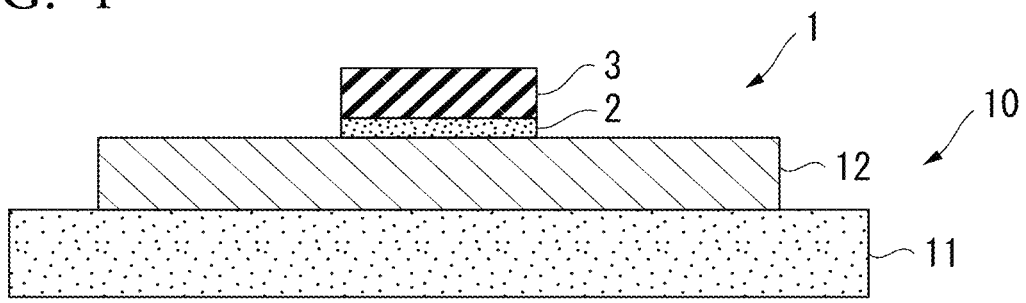
FIG. 1 is a view schematically describing a power module in which a power module substrate according to a first embodiment of the present invention is used.

A bonded body according to the present embodiment is a substrate 10 for a power module in which a ceramic substrate 11 as a ceramic member and a Cu foil 22 (circuit layer 12) as a Cu member are bonded to each other. FIG. 1 shows a power module 1 including the substrate 10 for a power module as the present embodiment.

The power module 1 includes the substrate 10 for a power module provided with the circuit layer 12 and a semiconductor element 3 bonded to one surface (upper surface in FIG. 1) of the circuit layer 12 through a solder layer 2.

Figure 2:
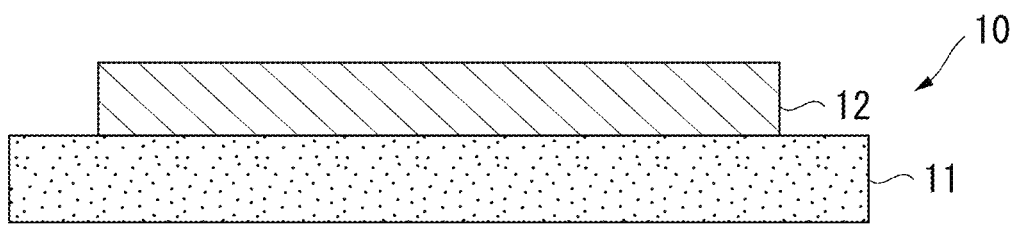
FIG. 2 is a view schematically describing the power module substrate according to the first embodiment of the present invention.

As shown in FIG. 2, the substrate 10 for a power module includes the ceramic substrate 11 and the circuit layer 12 provided on one surface (upper surface in FIG. 2) of the ceramic substrate 11.

The ceramic substrate 11 is constituted with ceramics such as aluminum nitride (AlN), silicon nitride ($Si_3N_4$), and alumina ($Al_2O_3$) having high insulating properties. In the present embodiment, the ceramic substrate 11 is constituted with aluminum nitride (AlN) having excellent heat radiation properties. The thickness of the ceramic substrate 11 is set within a range of 0.2 to 1.5 mm. In the present embodiment, the thickness of the ceramic substrate 11 is set to be 0.635 mm.

The circuit layer 12 is formed by bonding a metal sheet formed of Cu or a Cu alloy having conductivity to one surface of the ceramic substrate 11.

Figure 5:
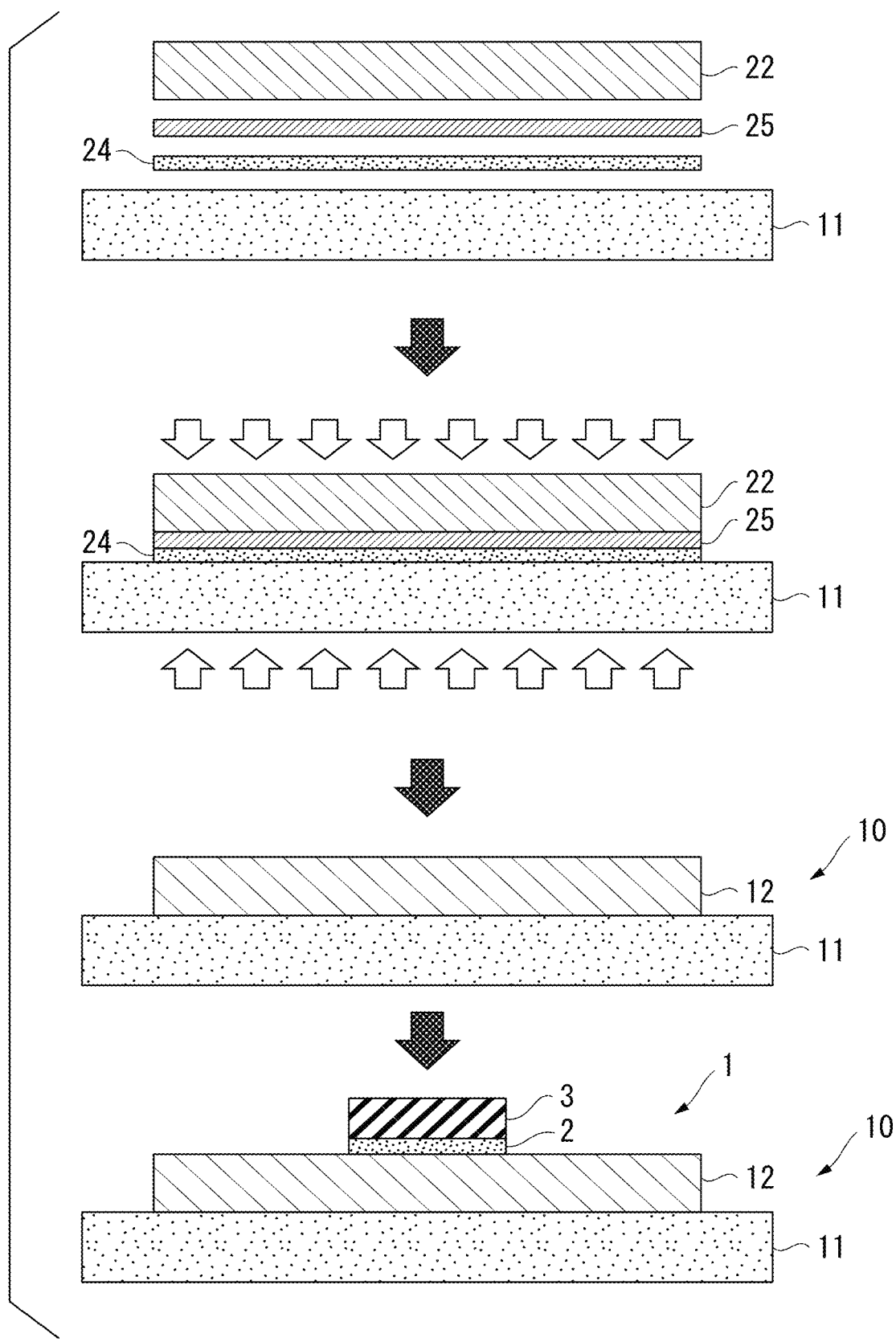
FIG. 5 is a view schematically describing the method for manufacturing the power module substrate and the method for manufacturing a power module according to the first embodiment of the present invention.

In the present embodiment, the circuit layer 12 is formed by laminating a Cu—P-based brazing material 24, a Ti material 25, and the Cu foil 22 formed of oxygen-free copper on one surface of the ceramic substrate 11 and performing a heat treatment such that the Cu foil 22 is bonded to the ceramic substrate 11 (see FIG. 5). In the present embodiment, as the Cu—P-based brazing material 24, a Cu—P—Sn—Ni brazing material is used.

A structure in which Sn forms a solid solution in Cu is established on the ceramic substrate 11 side on the circuit layer 12.

The thickness of the circuit layer 12 is set within a range equal to or greater than 0.1 mm and equal to or smaller than 1.0 mm. In the present embodiment, the thickness of the circuit layer 12 is set to be 0.2 mm.

Figure 3:
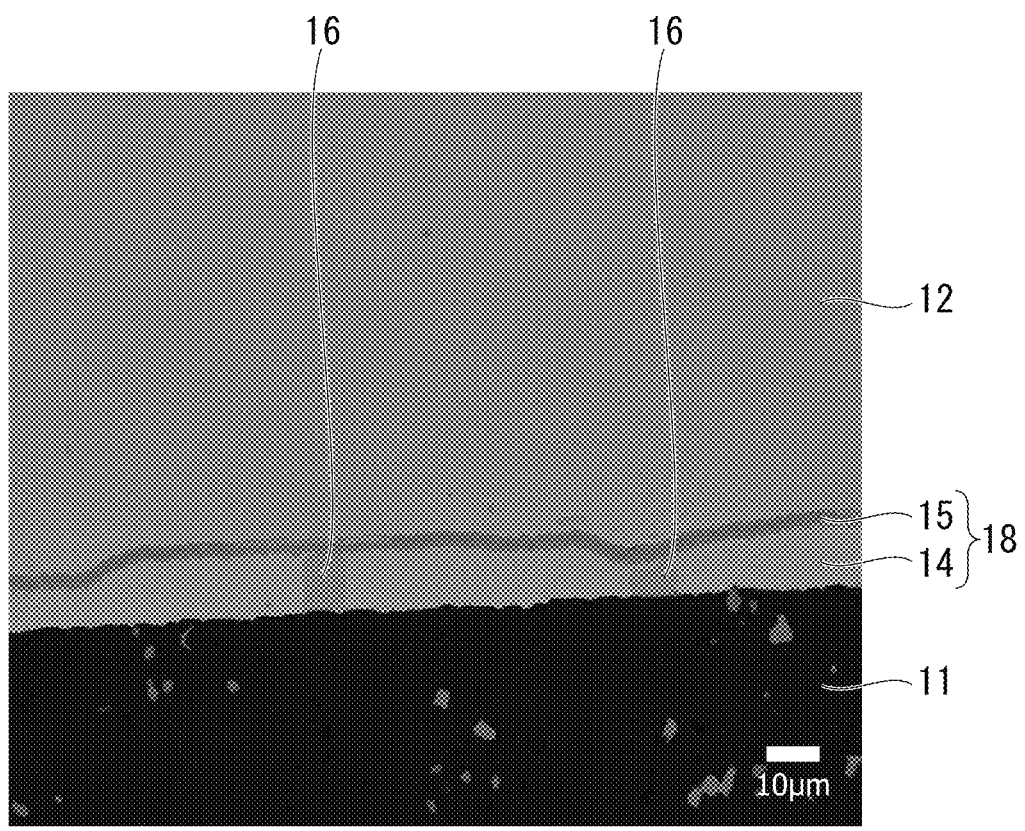
FIG. 3 is a photograph obtained by observing a cross-section of a bonding layer between a circuit layer and a ceramic substrate in the power module substrate shown in FIG. 2.

FIG. 3 is a view schematically describing a bonding layer 18 formed between the ceramic substrate 11 and the circuit layer 12.

Within the bonding layer 18 between the ceramic substrate 11 and the circuit layer 12, a Cu—Sn layer 14 is formed in the vicinity of a bonding surface of the ceramic substrate 11, and a Ti-containing layer 15 containing Ti is formed on the circuit layer 12 side of the Cu—Sn layer 14.

The Cu—Sn layer 14 is a layer in which Sn forms a solid solution in Cu. P contained in the Cu—P-based brazing material 24 is consumed by reacting with Ti of the Ti material 25. The Cu—Sn layer 14 is a layer formed by this reaction.

Examples of the Ti-containing layer 15 include a P—Ti-based intermetallic compound layer, a Ti layer, a Cu—Ti intermetallic compound layer, and the like. The constitution of the Ti-containing layer 15 varies with the amount of Ti contained in the Ti material 25, the bonding condition, and the like.

A $Cu_3P$ phase 16 is dispersed in the Cu—Sn layer 14. P contained in the Cu—P-based brazing material 24 remaining without reacting with Ti of the Ti material 25 reacts with Cu. The $Cu_3P$ phase 16 is generated by this reaction.

In the present embodiment, in the bonding layer 18 formed between the ceramic substrate 11 and the circuit layer 12, an area ratio of the $Cu_3P$ phase in a region extending by up to 50 μm toward the circuit layer 12 side from the bonding surface of the ceramic substrate 11 is equal to or lower than 15%.

The semiconductor element 3 is constituted with a semiconductor material such as Si. The semiconductor element 3 and the circuit layer 12 are bonded to each other through a solder layer 2.

The solder layer 2 is formed of a solder material based on Sn—Ag, Sn—In, or Sn—Ag—Cu, for example.

Figure 4:
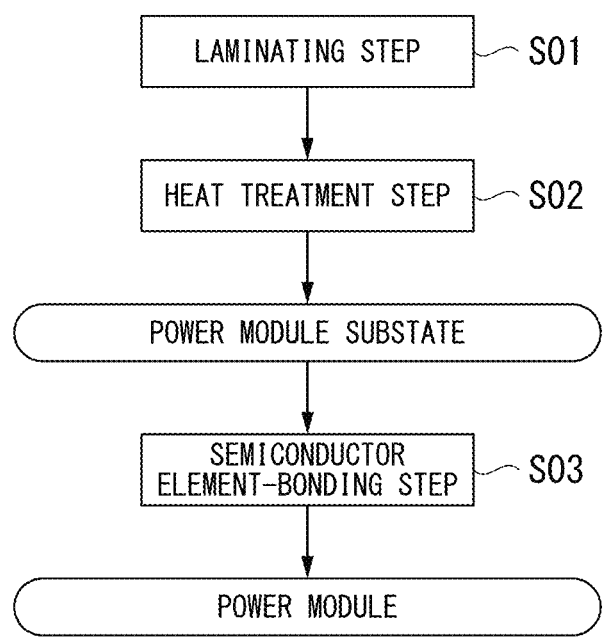
FIG. 4 is a flowchart describing a method for manufacturing the power module substrate and a method for manufacturing a power module according to the first embodiment of the present invention.

Hereinafter, methods for manufacturing the substrate 10 for a power module and the power module 1 according to the present embodiment will be described with reference to the flowchart shown in FIG. 4 and FIG. 5.

First, as shown in FIG. 5, the Cu—P-based brazing material 24, the Ti material 25, and the Cu foil 22 which will become the circuit layer 12 are laminated in this order on one surface (upper surface in FIG. 5) of the ceramic substrate 11 (laminating step S01).

In the laminating step S01, the Cu—P-based brazing material 24 and the Ti material 25 are disposed such that an atomic ratio [Ti/P] of Ti to P interposed between the ceramic substrate 11 and the Cu foil 22 falls into a range equal to or higher than 0.1 and equal to or lower than 0.8. Specifically, the thickness of the Cu—P-based brazing material 24 and the thickness of the Ti material 25 are adjusted in consideration of the content of P in the Cu—P-based brazing material 24 and the purity of the Ti material 25, so as to adjust the atomic ratio [Ti/P] of Ti to P interposed between the ceramic substrate 11 and the Cu foil 22.

In a case where the atomic ratio [Ti/P] of Ti to P interposed between the ceramic substrate 11 and the Cu foil 22 is less than 0.1, the amount of Ti reacting with P becomes insufficient. As a result, many $Cu_3P$ phases 16 may be formed, and the area ratio of the $Cu_3P$ phase in the region extending by up to 50 μm toward the circuit layer 12 side from the bonding surface of the ceramic substrate 11 could not be equal to or lower than 15%.

In contrast, in a case where the atomic ratio [Ti/P] of Ti to P interposed between the ceramic substrate 11 and the Cu foil 22 is higher than 0.8, a large amount of Ti is melted into the liquid phase of the brazing material generated at the time of heating. Therefore, the melting point of the liquid phase increases, and solidification easily proceeds. As a result, P which has not reacted with Ti remains, and many $Cu_3P$ phases 16 are formed.

Therefore, according to the present embodiment, in the laminating step S01, the atomic ratio [Ti/P] of Ti to P interposed between the ceramic substrate 11 and the Cu foil 22 is set within a range equal to or higher than 0.1 and equal to or lower than 0.8.

In order to further inhibit the generation of the $Cu_3P$ phase 16, the lower limit of the atomic ratio [Ti/P] of Ti to P interposed between the ceramic substrate 11 and the Cu foil 22 is preferably equal to or higher than 0.15, and more preferably equal to or higher than 0.2.

In addition, in order to further inhibit the generation of the $Cu_3P$ phase 16, the upper limit of the atomic ratio [Ti/P] of Ti to P interposed between the ceramic substrate 11 and the Cu foil 22 is preferably equal to or lower than 0.7, and more preferably equal to or lower than 0.6.

In a case where the thickness of the Ti material 25 is equal to or greater than 0.1 μm and less than 1 μm, it is preferable that the Ti material 25 is deposited by vapor deposition or sputtering. In a case where the thickness of the Ti material 25 is equal to or greater than 1 μm and equal to or smaller than 5 μm, it is preferable to use a foil material. The lower limit of the thickness of the Ti material 25 is preferably equal to or greater than 0.2 μm, and more preferably equal to or greater than 0.4 μm. The upper limit of the thickness of the Ti material 25 is preferably equal to or smaller than 3 μm, and more preferably equal to or smaller than 1.5 μm.

Then, the ceramic substrate 11, the Cu—P-based brazing material 24, the Ti material 25, and the Cu foil 22 are put into a vacuum heating furnace in a state where pressure (equal to or higher than 1 kgf/cm$^2$ and equal to or lower than 35 kgf/cm$^2$) is applied thereto in the lamination direction, and heated to a temperature equal to or higher than the melting start temperature of the Cu—P-based brazing material 24 (heat treatment step S02). In the present embodiment, the internal pressure of the vacuum heating furnace is set within a range equal to or higher than 10$^{-6}$ Pa and equal to or lower than 10$^{-3}$ Pa, the heating temperature is set within a range equal to or higher than 600° C. and equal to or lower than 650° C., and the heating time is set within a range equal to or longer than 30 minutes and equal to or shorter than 240 minutes.

In the heat treatment step S02, the heating rate at which the laminate reaches the aforementioned heating temperature is set within a range equal to or higher than 5° C./min and equal to or lower than 30° C./min.

In a case where the heating rate at which the laminate reaches the aforementioned heating temperature is less than 5° C./min, Ti is consumed by reacting with elements other than P in the process of heating. Therefore, the amount of Ti reacting with P becomes insufficient, and many Cu$_3$P phases 16 are formed. As a result, the area ratio of the Cu$_3$P phase in the region extending by up to 50 μm toward the circuit layer 12 side from the bonding surface of the ceramic substrate 11 could not become equal to or lower than 15%.

In contrast, in a case where the heating rate at which the laminate reaches the aforementioned heating temperature is higher than 30° C./min, Ti is rapidly diffused into the liquid phase of the brazing material. As a result, the liquid phase is rapidly solidified, a large amount of unreacted P remains, and many Cu$_3$P phases 16 are formed.

Therefore, in the present embodiment, the heating rate at which the laminate reaches the aforementioned heating temperature is set within a range equal to or higher than 5° C./min and equal to or lower than 30° C./min.

In order to further inhibit the generation of the Cu$_3$P phase 16, the lower limit of the heating rate at which the laminate reaches the aforementioned heating temperature is preferably equal to or higher than 7° C./min, and more preferably equal to or higher than 10° C./min.

In addition, in order to further inhibit the generation of the Cu$_3$P phase 16, the upper limit of the heating rate at which the laminate reaches the aforementioned heating temperature is preferably equal to or lower than 25° C./min, and more preferably equal to or lower than 20° C./min.

In the heat treatment step S02, the Cu—P-based brazing material 24 is melted and forms a liquid phase. The Ti material 25 is melted into the liquid phase, and the liquid phase is solidified. As a result, the ceramic substrate 11 and the Cu foil 22 are bonded to each other. At this time, P in the Cu—P-based brazing material 24 is bonded to Ti of the Ti material 25. Consequently, the Cu—Sn layer 14 is formed on the bonding surface side of the ceramic substrate 11.

As a result, the circuit layer 12 is formed on one surface of the ceramic substrate 11, and the substrate 10 for a power module as the present embodiment is manufactured.

Then, the semiconductor element 3 is bonded to the upper surface of the circuit layer 12 of the substrate 10 for a power module through a solder material (semiconductor element-bonding step S03).

In this way, the power module 1 according to the present embodiment is manufactured.

According to the substrate 10 for a power module of the present embodiment constituted as above, in the bonding layer 18 formed between the ceramic substrate 11 and the circuit layer 12, the area ratio of the Cu$_3$P phase 16 in the region extending by up to 50 μm toward the circuit layer 12 side from the bonding surface of the ceramic substrate 11 is equal to or lower than 15%. Therefore, the brittle Cu$_3$P phase 16 takes up a small area in the bonding layer 18, and for example, even in a case where a thermal cycle reaching a relatively high temperature such as a temperature equal to or higher than 200° C. is loaded, it is possible to inhibit partial discharge from occurring on the circuit layer 12 side due to the Cu$_3$P phase 16. Accordingly, the substrate 10 for a power module according to the present embodiment has high reliability at the time of being used in a high-temperature environment.

Furthermore, in the present embodiment, in the laminating step S01 of laminating the ceramic substrate 11 and the Cu foil 22, which will become the circuit layer 12, through the Cu—P-based brazing material 24 and the Ti material 25, the Cu—P-based brazing material 24 and the Ti material 25 are disposed such that the atomic ratio [Ti/P] of Ti to P interposed between the ceramic substrate 11 and the Cu foil 22 falls into a range equal to or higher than 0.1 and equal to or lower than 0.8. Therefore, the amount of Ti reacting with P is secured, and the amount of unreacted P is reduced. As a result, the formation of the Cu$_3$P phase 16 can be inhibited. Accordingly, the occurrence of partial discharge can be inhibited.

In addition, in the present embodiment, the heating rate at which the laminate reaches the heating temperature in the heat treatment step S02 is equal to or higher than 5° C./min and equal to or lower than 30° C./min. Therefore, the formation of the Cu$_3$P phase 16 can be inhibited. Accordingly, the occurrence of partial discharge can be inhibited.

The pressure applied in the heat treatment step S02 is equal to or higher than 1 kgf/cm$^2$. Therefore, it is possible to bring the ceramic substrate 11 into close contact with the liquid phase of the Cu—P-based brazing material 24 and to excellently bond the ceramic substrate 11 and the Cu—Sn layer 14 to each other. Furthermore, because the applied pressure is equal to or lower than 35 kgf/cm$^2$, the occurrence of breaking in the ceramic substrate 11 can be inhibited.

Second Embodiment

Next, a second embodiment of the present invention will be described. Note that the same constituents as those in the first embodiment will be described using the same reference signs and will not be specifically described.

Figure 6:
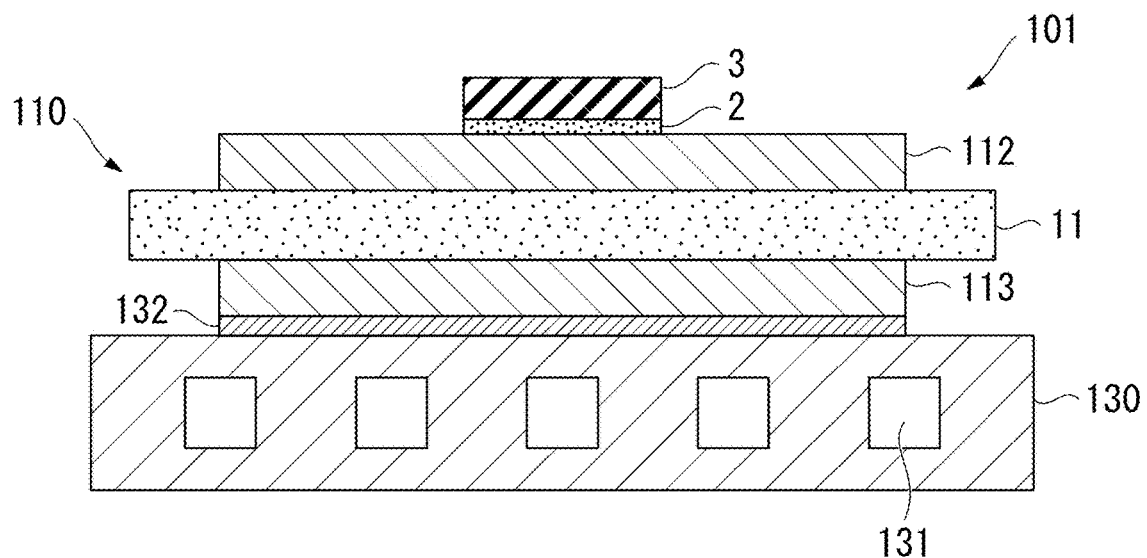
FIG. 6 is a view schematically describing a power module in which a power module substrate according to a second embodiment of the present invention is used.

FIG. 6 shows a power module 101 including a substrate 110 for a power module according to the second embodiment.

The power module 101 includes the substrate 110 for a power module provided with a circuit layer 112 and a metal layer 113, the semiconductor element 3 bonded to one surface (upper surface in FIG. 6) of the circuit layer 112 through the solder layer 2, and a heat sink 130 disposed on the other side (lower side in FIG. 6) of the metal layer 113.

Figure 7:
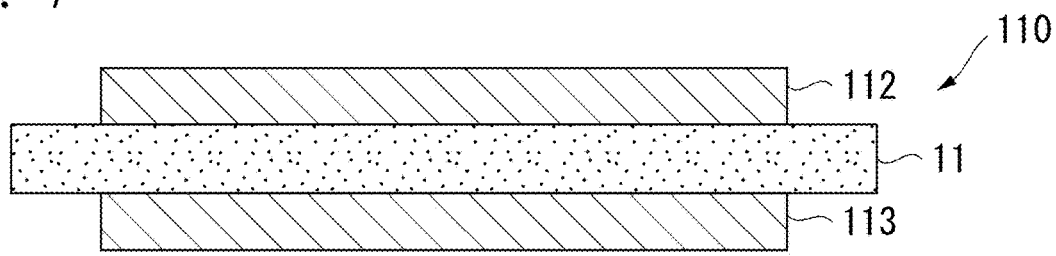
FIG. 7 is a view schematically describing the power module substrate according to the second embodiment of the present invention.

As shown in FIG. 7, the substrate 110 for a power module includes the ceramic substrate 11, the circuit layer 112 provided on one surface (upper surface in FIG. 7) of the ceramic substrate 11, and the metal layer 113 provided on the other surface (lower surface in FIG. 7) of the ceramic substrate 11.

The ceramic substrate 11 is constituted with aluminum nitride (AlN) having excellent heat radiation properties as in the first embodiment.

Figure 10:
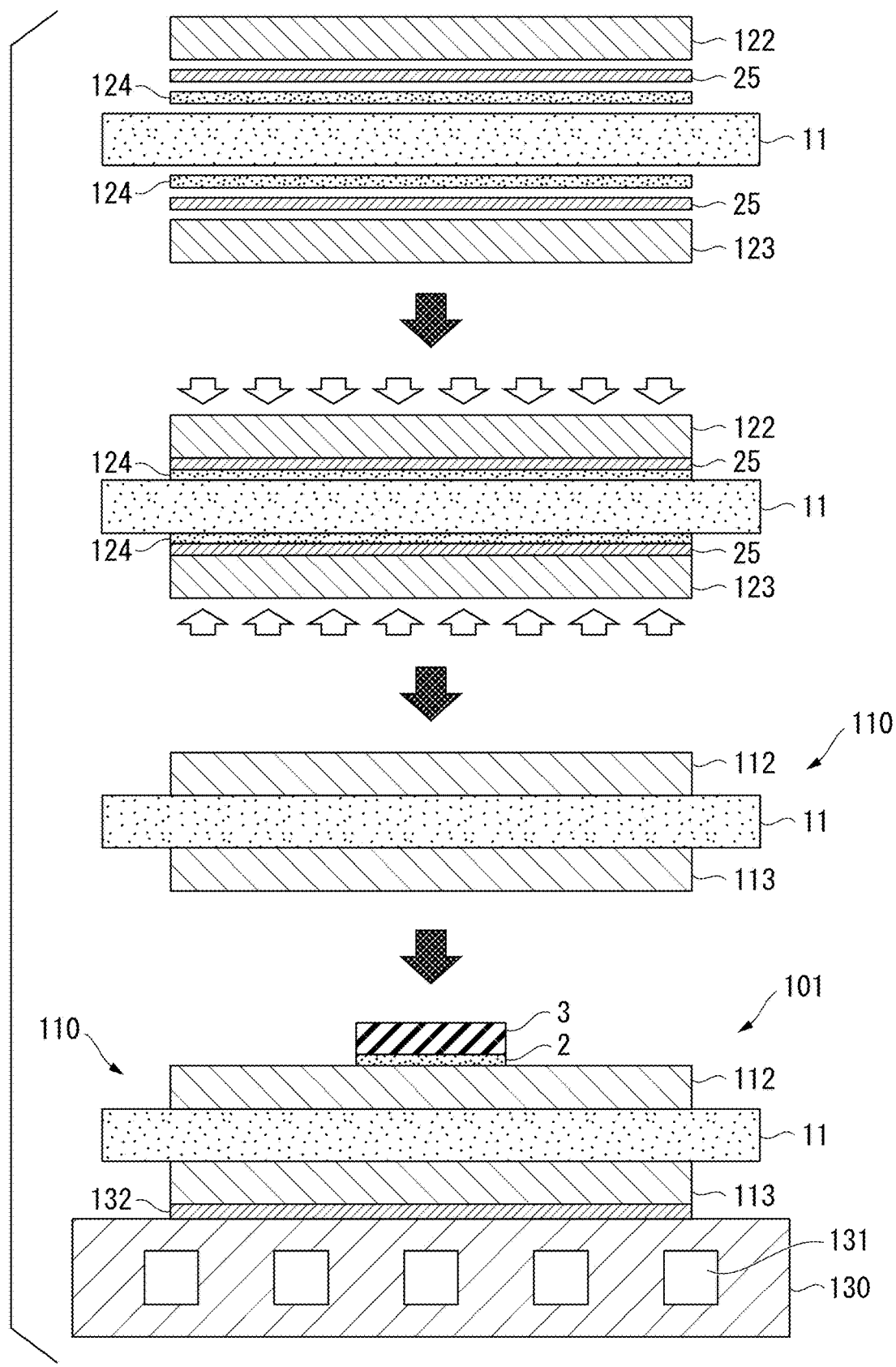
FIG. 10 is a view schematically describing the method for manufacturing the power module substrate and the method for manufacturing a power module according to the second embodiment of the present invention.

As in the first embodiment, the circuit layer 112 is formed by laminating a Cu—P-based brazing material 124, the Ti material 25, and a Cu foil 122 formed of oxygen-free copper in this order on one surface of the ceramic substrate 11, and performing a heat treatment so as to bond the Cu foil 122 to the ceramic substrate 11 (see FIG. 10).

The thickness of the circuit layer 112 is set within a range equal to or greater than 0.1 mm and equal to or smaller than 1.0 mm. In the present embodiment, the thickness of the circuit layer 112 is set to be 0.2 mm.

By bonding a metal sheet of Cu or a Cu alloy to the other surface of the ceramic substrate 11 through the Cu—P-based brazing material 124, the metal layer 113 is formed. In the present embodiment, by laminating the Cu—P-based brazing material 124, the Ti material 25, and a Cu foil 123 formed of oxygen-free copper on the other surface of the ceramic substrate 11 and performing a heat treatment so as to bond the Cu foil 123 to the ceramic substrate 11, the metal layer 113 is formed (see FIG. 10).

The thickness of the metal layer 113 is set within a range equal to or greater than 0.1 mm and equal to or smaller than 1.0 mm. In the present embodiment, the thickness of the metal layer 113 is set to be 0.15 mm.

In the present embodiment, as the Cu—P-based brazing material 124, specifically, a Cu—P—Sn—Ni brazing material is used.

Figure 8:
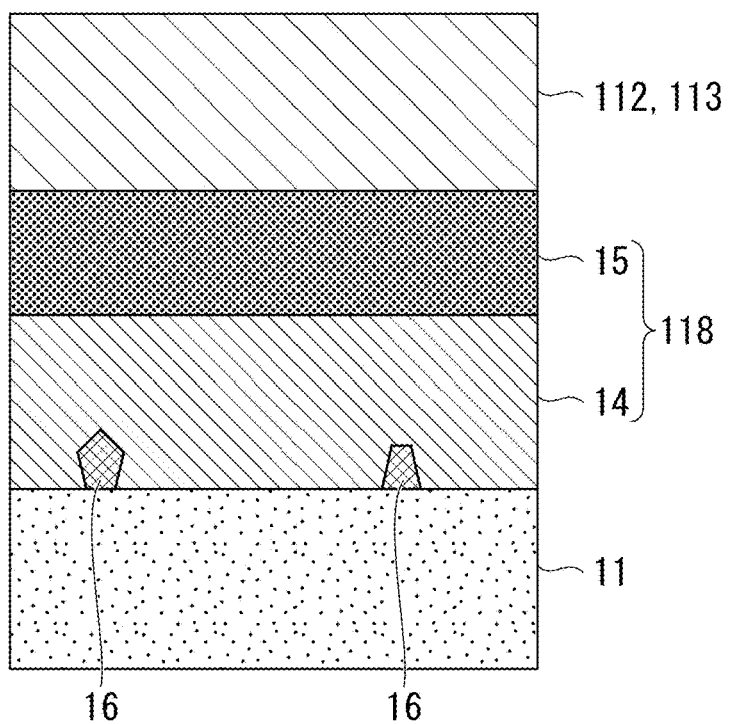
FIG. 8 is a schematic cross-sectional view of a bonded interface between a circuit layer as well as a metal layer and a ceramic substrate in the power module substrate shown in FIG. 7.

FIG. 8 is a view schematically describing a cross-section of a bonding layer 118 between the ceramic substrate 11 and the circuit layer 112 as well as the metal layer 113.

Within the bonding layer 118 between the ceramic substrate 11 and the circuit layer 112 as well as the metal layer 113, the Cu—Sn layer 14 is formed in the vicinity of the bonding surface of the ceramic substrate 11, and the Ti-containing layer 15 containing Ti is formed on the circuit layer 112 side and the metal layer 113 side of the Cu—Sn layer 14.

The $Cu_3P$ phase 16 is dispersed in the Cu—Sn layer 14. P remaining without reacting with Ti of the Ti material 25 reacts with Cu, and by this reaction, the $Cu_3P$ phase 16 is generated.

In the present embodiment, in the bonding layer 118 formed between the ceramic substrate 11, and the circuit layer 112 as well as the metal layer 113, an area ratio of the $Cu_3P$ phase in a region extending by up to 50 μm toward the circuit layer 112 side and the metal layer 113 side from the bonding surface of the ceramic substrate 11 is equal to or lower than 15%.

The heat sink 130 dissipates the heat from the aforementioned substrate 110 for a power module. The heat sink 130 is constituted with Cu or a Cu alloy. In the present embodiment, the heat sink 130 is constituted with oxygen-free copper. The heat sink 130 is provided with passages 131 for a cooling fluid to flow through the passages. In the present embodiment, the heat sink 130 and the metal layer 113 are bonded to each other by a solder layer 132 formed of a solder material.

Figure 9:
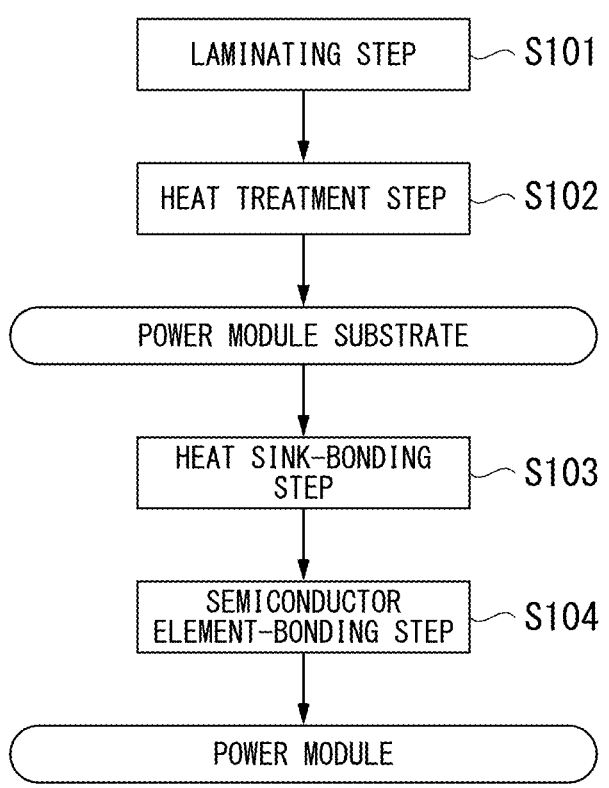
FIG. 9 is a flowchart describing a method for manufacturing the power module substrate and a method for manufacturing a power module according to the second embodiment of the present invention.

Hereinafter, a method for manufacturing the power module 101 according to the present embodiment will be described with reference to the flowchart in FIG. 9 and FIG. 10.

First, as shown in FIG. 10, the Cu—P-based brazing material 124, the Ti material 25, and the Cu foil 122 which will become the circuit layer 112 are laminated in this order on one surface (upper surface in FIG. 10) of the ceramic substrate 11, and the Cu—P-based brazing material 124, the Ti material 25, and the Cu foil 123 which will become the metal layer 113 are laminated in this order on the other surface (lower surface in FIG. 10) of the ceramic substrate 11 (laminating step S101).

In the laminating step S101, the Cu—P-based brazing material 124 and the Ti material 25 are disposed such that the atomic ratio [Ti/P] of Ti to P interposed between the ceramic substrate 11 and the Cu foils 122 and 123 falls into a range equal to or higher than 0.1 and equal to or lower than 0.8. Specifically, the thickness of the Cu—P-based brazing material 124 and the thickness of the Ti material 25 are adjusted in consideration of the content of P in the Cu—P-based brazing material 124 and the purity of the Ti material 25 so as to adjust the atomic ratio [Ti/P] of Ti to P interposed between the ceramic substrate 11 and the Cu foil 22.

Then, the Cu foil 122, the Ti material 25, the Cu—P-based brazing material 124, the ceramic substrate 11, the Cu—P-based brazing material 124, the Ti material 25, and the Cu foil 123 are put into a vacuum heating furnace in a state where pressure (equal to or higher than 1 kgf/cm$^2$ and equal to or lower than 35 kgf/cm$^2$) is applied thereto in the lamination direction, and heated to a temperature equal to or higher than the melting start temperature of the Cu—P-based brazing material 124 (heat treatment step S102).

In the heat treatment step S102, a heating rate at which the laminate reaches the aforementioned heating temperature is within a range equal to or higher than 5° C./min and equal to or lower than 30° C./min.

In the heat treatment step S102, the Cu—P-based brazing material 124 is melted and forms a liquid phase. The Ti material 25 is melted into the liquid phase, and the liquid phase is solidified. As a result, the ceramic substrate 11 is bonded to the Cu foil 122 and the Cu foil 123. At this time, P contained in the Cu—P-based brazing material 124 is bonded to Ti of the Ti material 25, and the Cu—Sn layer 14 is formed on the ceramic substrate 11 side.

Accordingly, the circuit layer 112 is formed on one surface of the ceramic substrate 11, and the metal layer 113 is formed on the other surface of the ceramic substrate 11. In this way, the substrate 110 for a power module as the present embodiment is manufactured.

Then, the heat sink 130 is bonded to the lower surface of the metal layer 113 of the substrate 110 for a power module through a solder material (heat sink bonding step S103).

Thereafter, the semiconductor element 3 is bonded to the upper surface of the circuit layer 112 of the substrate 110 for a power module through a solder material (semiconductor element-bonding step S104).

In this way, the power module 101 according to the present embodiment is manufactured.

In the substrate 110 for a power module according to the present embodiment constituted as above, in the bonded interface between the ceramic substrate 11 and the circuit layer 112 and in the bonding layer 118 between the ceramic substrate 11 and the metal layer 113, the area ratio of the $Cu_3P$ phase 16 in the region extending by up to 50 toward the circuit layer 112 side and the metal layer 113 side from the bonding surface of the ceramic substrate 11 is equal to or lower than 15%. Therefore, the brittle $Cu_3P$ phase 16 takes up a small area in the bonding layer 118, and for example, even in a case where a thermal cycle reaching a relatively high temperature such as a temperature equal to or higher than 200° C. is loaded, it is possible to inhibit the occurrence of partial discharge.

The method for manufacturing the substrate 110 for a power module according to the present embodiment adopts a constitution in which the bonding of the circuit layer 112 to one surface of the ceramic substrate 11 and the bonding of the metal layer 113 to the other surface of the ceramic substrate 11 are simultaneously performed. Therefore, it is possible to simplify the manufacturing process and to reduce the manufacturing cost.

Third Embodiment

Next, a third embodiment of the present invention will be described. Note that the same constituents as those in the first embodiment will be described using the same reference signs and will not be specifically described.

Figure 11:
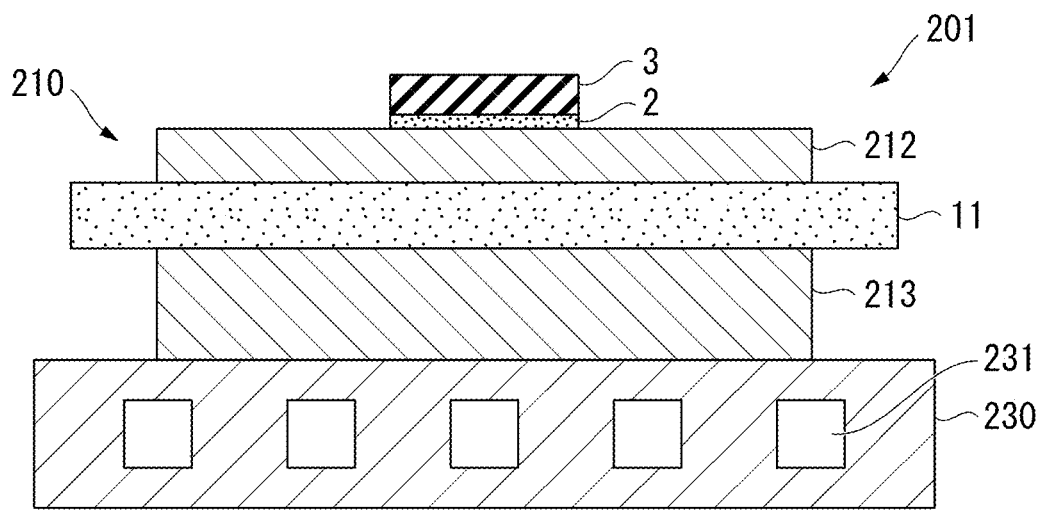
FIG. 11 is a view schematically describing a power module in which a power module substrate according to a third embodiment of the present invention is used.

FIG. 11 shows a power module 201 including a substrate 210 for a power module according to the third embodiment.

The power module 201 includes the substrate 210 for a power module provided with a circuit layer 212 and a metal layer 213, the semiconductor element 3 bonded to one surface (upper surface in FIG. 11) of the circuit layer 212 through the solder layer 2, and a heat sink 230 bonded to the other side (lower side in FIG. 11) of the substrate 210 for a power module.

Figure 12:
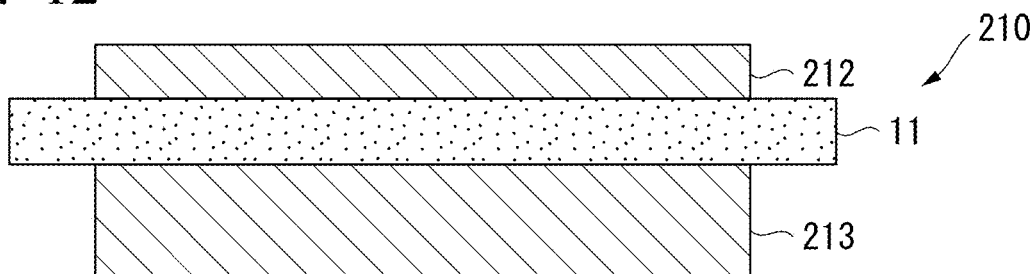
FIG. 12 is a view schematically describing the power module substrate according to a third embodiment of the present invention.

As shown in FIG. 12, the substrate 210 for a power module includes the ceramic substrate 11, the circuit layer 212 provided on one surface (upper surface in FIG. 12) of the ceramic substrate 11, and the metal layer 213 provided on the other surface (lower surface in FIG. 12) of the ceramic substrate 11.

The ceramic substrate 11 is constituted with aluminum nitride (AlN) having excellent heat radiation properties as in the first embodiment.

Figure 15:
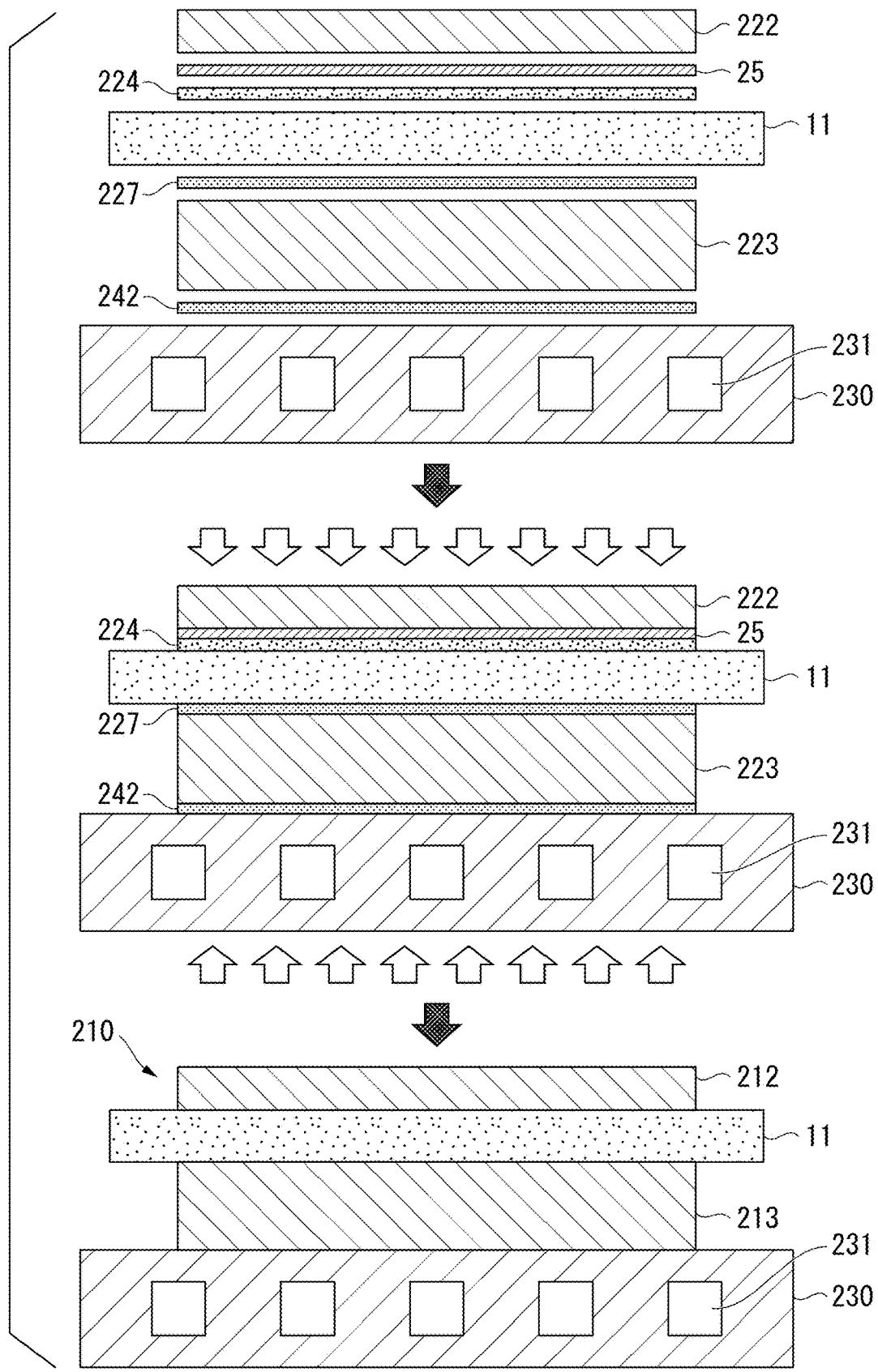
FIG. 15 is a view schematically describing the method for manufacturing the power module substrate and the method for manufacturing a power module according to the third embodiment of the present invention.

As in the first embodiment, the circuit layer 212 is formed by laminating a Cu—P-based brazing material 224, the Ti material 25, and a Cu foil 222 formed of oxygen-free copper on one surface of the ceramic substrate 11 and performing a heat treatment such that the Cu foil 222 is bonded to the ceramic substrate 11 (see FIG. 15).

The thickness of the circuit layer 212 is set within a range equal to or greater than 0.1 mm and equal to or smaller than 1.0 mm. In the present embodiment, the thickness of the circuit layer 212 is set to be 0.2 mm.

In the present embodiment, as the Cu—P-based brazing material 224, specifically, a Cu—P—Sn—Ni brazing material is used.

Figure 13:
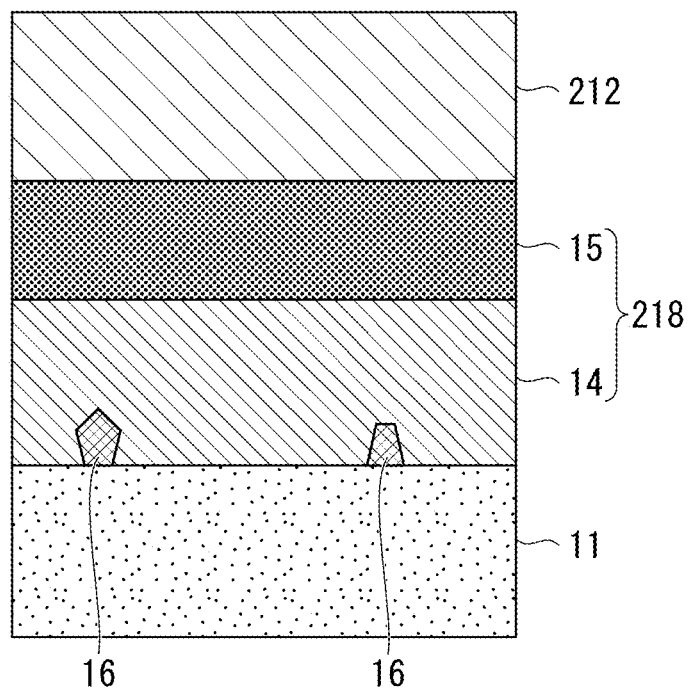
FIG. 13 is a cross-sectional view schematically describing a bonded interface between a circuit layer and a ceramic substrate in the power module substrate shown in FIG. 12.

FIG. 13 is a view schematically describing a cross-section of a bonding layer 218 between the ceramic substrate 11 and the circuit layer 212.

Within the bonding layer 218 between the ceramic substrate 11 and the circuit layer 212, the Cu—Sn layer 14 is formed in the vicinity of the bonding surface of the ceramic substrate 11, and the Ti-containing layer 15 containing Ti is formed on the circuit layer 212 side of the Cu—Sn layer 14.

The $Cu_3P$ phase 16 is dispersed in the Cu—Sn layer 14. P remaining without reacting with Ti of the Ti material 25 reacts with Cu, and by this reaction, the $Cu_3P$ phase 16 is generated.

In the present embodiment, in the bonding layer 218 formed between the ceramic substrate 11 and the circuit layer 212, an area ratio of the $Cu_3P$ phase 16 in a region extending by up to 50 µm toward the circuit layer 212 side from the bonding surface of the ceramic substrate 11 is equal to or lower than 15%.

By bonding an Al sheet formed of Al or an Al alloy to the other surface of the ceramic substrate 11, the metal layer 213 is formed. In the present embodiment, the metal layer 213 is formed by bonding an Al sheet 223 having a purity equal to or higher than 99.99 mass % to the other surface of the ceramic substrate 11 (see FIG. 15). In the present embodiment, the Al sheet 223 is bonded using the bonding material 227 formed of an Al—Si-based brazing material.

The thickness of the metal layer 213 is set within a range equal to or greater than 0.1 mm and equal to or smaller than 3.0 mm. In the present embodiment, the thickness of the metal layer 213 is set to be 2.1 mm.

The heat sink 230 is constituted with Al or an Al alloy. In the present embodiment, the heat sink 230 is constituted with A6063 (Al alloy). The heat sink 230 is provided with passages 231 for a cooling fluid to flow through the passages. The heat sink 230 and the metal layer 213 are bonded to each other by a bonding material 242 formed of an Al—Si-based brazing material.

Figure 14:
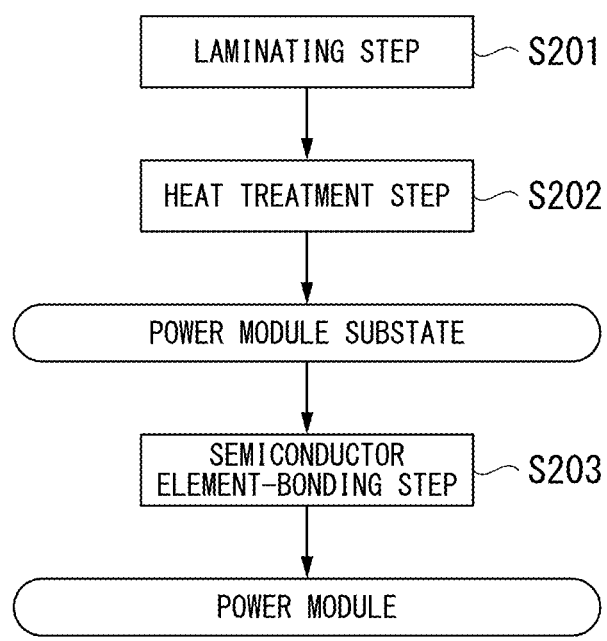
FIG. 14 is a flowchart describing a method for manufacturing the power module substrate and a method for manufacturing a power module according to the third embodiment of the present invention.

Next, a method for manufacturing the power module 201 according to the present embodiment will be described with reference to the flowchart in FIG. 14 and FIG. 15.

First, as shown in FIG. 15, the Cu—P-based brazing material 224, the Ti material 25, and the Cu foil 222 which will become the circuit layer 212 are laminated in this order on one surface (upper surface in FIG. 15) of the ceramic substrate 11, and the Al sheet 223 which will become the metal layer 213 is laminated on the other surface (lower surface in FIG. 15) of the ceramic substrate 11 through the bonding material 227. Furthermore, the heat sink 230 is laminated on the lower side of the Al sheet 223 through the bonding material 242 (laminating step S201).

In the laminating step S201, the Cu—P-based brazing material 224 and the Ti material 25 are disposed such that an atomic ratio [Ti/P] of Ti to P interposed between the ceramic substrate 11 and the Cu foil 222 falls in to a range equal to or higher than 0.1 and equal to or lower than 0.8. Specifically, the thickness of the Cu—P-based brazing material 224 and the thickness of the Ti material 25 are adjusted in consideration of the content of P in the Cu—P-based brazing material 224 and the purity of the Ti material 25 so as to adjust the atomic ratio [Ti/P] of Ti to P interposed between the ceramic substrate 11 and the Cu foil 222.

Thereafter, the ceramic substrate 11, the Cu—P-based brazing material 224, the Ti material 25, the Cu foil 222, the bonding material 227, the Al sheet 223, the bonding material 242, and the heat sink 230 are put into a vacuum heating furnace in a state where pressure (1 to 35 kgf/cm$^2$) is applied thereto in the lamination direction, and heated (heat treatment step S202). In the present embodiment, the internal pressure of the vacuum heating furnace is set within a range equal to or higher than $10^{-6}$ Pa and equal to or lower than $10^{-3}$ Pa, the heating temperature is set within a range equal to or higher than 600° C. and equal to or lower than 650° C., and the heating time is set within a range equal to or longer than 30 minutes and equal to or shorter than 240 minutes.

In the heat treatment step S202, a heating rate at which the laminate reached the aforementioned heating temperature is within a range equal to or higher than 5° C./min and equal to or lower than 30° C./min.

In the heat treatment step S202, the Cu—P-based brazing material 224 is melted and forms a liquid phase. The Ti material 25 is melted into the liquid phase, and the liquid phase is solidified. As a result, the ceramic substrate 11 and the Cu foil 222 are bonded to each other. At this time, P in the Cu—P-based brazing material 224 is bonded to Ti of the Ti material 25, and the Cu—Sn layer 14 is formed on the ceramic substrate 11 side.

In addition, in the heat treatment step S202, the bonding material 227 is melted and forms a liquid phase, and the liquid phase is solidified. As a result, the ceramic substrate 11 and the Al sheet 223 are bonded to each other through the bonding material 227. Furthermore, in the heat treatment step S202, the bonding material 242 is melted and forms a liquid phase, and the liquid phase is solidified. As a result, the Al sheet 223 and the heat sink 230 are bonded to each other through the bonding material 242.

In this way, the substrate 210 for a power module and a power module substrate with a heat sink as the present embodiment are manufactured.

Then, the semiconductor element 3 is bonded to the upper surface of the circuit layer 212 of the substrate 210 for a power module through a solder material (semiconductor element-bonding step S203).

In this way, the power module 201 as the present embodiment is manufactured.

The substrate 210 for a power module according to the present embodiment constituted as above exerts the same effects as those exerted by the substrate 10 for a power module described in the first present embodiment.

Furthermore, in the substrate 210 for a power module according to the present embodiment, by the bonding of the Al sheet 223 to the other surface of the ceramic substrate 11, the metal layer 213 is formed. Accordingly, the heat from the semiconductor element 3 can be efficiently dissipated through the metal layer 213. In addition, because Al has a relatively low deformation resistance, in a case where a thermal cycle is loaded, the metal layer 213 can absorb a thermal stress caused between the substrate 210 for a power module and the heat sink 230, and the occurrence of breaking in the ceramic substrate 11 can be inhibited.

According to the method for manufacturing the substrate 210 for a power module according to the present embodiment, the ceramic substrate 11 and the Cu foil 222 can be bonded to each other at a relatively low temperature. Therefore, the bonding of the circuit layer 212 formed of the Cu foil 222 and the bonding of the metal layer 213 formed of the Al sheet 223 can be simultaneously performed. Accordingly, it is possible to simplify the manufacturing process and to reduce the manufacturing cost.

Hitherto, the embodiments of the present invention have been described. However, the present invention is not limited thereto and can be appropriately modified within a scope that does not depart from the technical idea of the present invention.

For example, in the present embodiment, a case was described where a semiconductor element is mounted on the insulated circuit board so as to constitute a power module. However, the present invention is not limited thereto. For instance, an LED element may be mounted on the circuit layer of the insulated circuit board so as to constitute an LED module, or a thermoelectric element may be mounted on the circuit layer of the insulated circuit board so as to constitute a thermoelectric module.

In the second embodiment and the third embodiment, a case was described where the bonding of the circuit layer to one surface of the ceramic substrate and the bonding of the metal layer to the other surface of the ceramic substrate are simultaneously performed. However, the circuit layer and the metal layer may be separately bonded.

In addition, in the third embodiment, a case was described where the circuit layer, the metal layer, and the heat sink are simultaneously bonded. However, a constitution may be adopted in which the circuit layer and the metal layer are bonded to the ceramic substrate, and then the metal layer and the heat sink are bonded to each other.

Furthermore, in the third embodiment, a case was described where the metal layer is bonded to the other surface of the ceramic substrate through the Al—Si-based brazing material. However, the metal layer may be bonded using a transient liquid phase (TLP) bonding method, Ag paste, or the like.

In the second embodiment and the third embodiment, a case was described where a heat sink provided with passages is used. However, a plate-like member called a radiating plate or a member having a pin-like fin may be used.

Furthermore, a case was described above where the power module substrate and the heat sink are bonded to each other by using a solder material or a brazing material. However, a constitution may be adopted in which the power module substrate and the heat sink are fastened to each other by a screw and the like through grease provided therebetween.

In addition, in the power module substrate in the second embodiment and the third embodiment, a heat sink may not be bonded to the other surface side of the power module substrate.

As the Ti material, a Ti foil may be used. Alternatively, the Ti material may be formed by vapor deposition or sputtering. Furthermore, a Cu member/Ti clad material in which Ti is provided on one surface of a Cu member can also be used.

Furthermore, it is also possible to use a Ti material/ brazing material clad material in which a Cu—P-based brazing material is provided on one surface of a Ti material or a Cu member/Ti material/brazing material clad in which a Cu member, a Ti material, and a Cu—P-based brazing material are laminated in this order.

In the above embodiments, a case where a Cu—P—Sn—Ni brazing material is used as the Cu—P-based brazing material was described. However, other Cu—P-based brazing materials such as a Cu—P brazing material may also be used. Hereinafter, the Cu—P-based brazing material suitable for the method for manufacturing the bonded body of the present invention will be specifically described.

The content of P in the Cu—P-based brazing material is preferably equal to or greater than 3 mass % and equal to or smaller than 10 mass %.

P is an element having an operation and effect of reducing the melting start temperature of the brazing material. In a case where P is oxidized, P oxide occurs. P is an element having an operation and effect of coating the surface of the brazing material with the P oxide so as to prevent the oxidation of the brazing material, and coating the surface of the molten brazing material with the P oxide having excellent fluidity so as to improve the wettability of the brazing material.

In a case where the content of P is less than 3 mass %, the effect of reducing the melting start temperature of the brazing material may not be sufficiently obtained. Accordingly, the inciting start temperature of the brazing material may be increased or the fluidity of the brazing material may become insufficient. As a result, the bonding properties between the ceramic substrate and the circuit layer may be reduced.

Furthermore, in a case where the content of P is greater than 10 mass %, a large amount of brittle intermetallic compound may be formed. As a result, the bonding properties and the bonding reliability between the ceramic substrate and the circuit layer may be reduced.

For these reasons, the content of P in the Cu—P-based brazing material is preferably within a range equal to or greater than 3 mass % and equal to or smaller than 10 mass %.

The content of Sn in the Cu—P-based brazing material may be equal to or greater than 0.5 mass % and equal to or smaller than 25 mass %.

Sn is an element having an operation and effect of reducing the melting point of the brazing material. In a case where the content of Sn is equal to or greater than 0.5 mass %, the melting point of the brazing material can be reliably reduced. In a case where the content of Sn is equal to or smaller than 25 mass %, it is possible to inhibit the brazing material from becoming brittle at a low temperature and to improve the bonding reliability between the ceramic substrate and the circuit layer.

For these reasons, in a case where Sn is incorporated into the Cu—P-based brazing material, the content of Sn in the Cu—P-based brazing material is preferably within a range equal to or greater than 0.5 mass % and equal to or smaller than 25 mass %.

The Cu—P-based brazing material may contain one kind of element or two or more kinds of elements among Ni, Cr, Fe, and Mn in an amount equal to or greater than 2 mass % and equal to or smaller than 20 mass %.

Ni, Cr, Fe, and Mn are elements having an operation and effect of inhibiting the formation of an intermetallic compound containing P in the interface between the ceramic substrate and the brazing material.

In a case where the content of one kind of element or two or more kinds of elements among Ni, Cr, Fe, and Mn is equal to or greater than 2 mass %, the formation of an intermetallic compound containing P in the bonded interface between the ceramic substrate and the brazing material can be inhibited, and the bonding reliability between the ceramic substrate and the circuit layer can be improved. Furthermore, in a case where the content of one kind of element or two or more kinds of elements among Ni, Cr, Fe, and Mn is equal to or smaller than 20 mass %, it is possible to inhibit the increase of the melting start temperature of the brazing material, to inhibit the decrease of the fluidity of the brazing material, and to improve the bonding properties between the ceramic substrate and the circuit layer.

For these reasons, in a case where the Cu—P-based brazing material contains one kind of element or two or more kinds of elements among Ni, Cr, Fe, and Mn, the content of the element is preferably within a range equal to or greater than 2 mass % and equal to or smaller than 20 mass %.

EXAMPLES

Example 1

Hereinafter, the results of experiments (Example 1) performed to check the effects of the present invention will be described.

A Cu—P-based brazing material shown in Table 1, a Ti material, and a Cu foil (37 mm×37 mm×0.2 mmt) formed of oxygen-free copper were laminated in this order on one surface of a ceramic substrate (40 mm×40 mm×0.635 mmt) formed of AlN. At this time, the Cu—P-based brazing material and the Ti material were disposed such that an atomic ratio [Ti/P] of Ti to P interposed between the ceramic substrate and the Cu foil became the number described in Table 1.

As the ceramic substrate of the present example, a sintered ceramic substrate was used in which $ZrO_2$ was added in an amount of 10 mass % with respect to 100 mass % of AlN.

As the heat treatment step, the aforementioned laminate was put into a vacuum heating furnace in a state where a pressure of 15 kgf/cm$^2$ was applied thereto in the lamination direction, and heated to a temperature equal to or higher than the melting start temperature of the Cu—P-based brazing material so as to bond the Cu foil to one surface of the ceramic substrate, thereby forming a circuit layer.

The heating temperature, the holding time at the heating temperature, and the heating rate at which the laminate reaches the heating temperature in the heat treatment step were set according to the conditions shown in Table 1.

In this way, power module substrates of Examples 1-1 to 1-8 of the present invention and Comparative Examples 1-1 to 1-4 were obtained.

The power module substrates obtained as above were evaluated in terms of the area ratio of a $Cu_3P$ phase in the vicinity of the ceramic substrate in the bonding layer between the ceramic substrate and the circuit layer and in terms of the partial discharge characteristics.

(AREA RATIO OF $CU_3P$ PHASE)

By using an electron micro analyzer (EPMA), a cross-section of the Cu foil/ceramic substrate interface of each of the power module substrates was observed at 750× magnification, and an area a of a region A extending by up to 50 μm toward the Cu foil side from the bonding surface of the ceramic substrate was determined. Then, in the region A, a region B in which the P concentration is 22 at % to 28 at % was regarded as a $Cu_3P$ phase, an area b thereof was determined, and an area ratio (%) of the $Cu_3P$ phase was determined by area b/area a. The evaluation results are shown in Table 1. The observation was performed in five visual fields, and the average of area ratios in the five visual fields was taken as the area ratio of the $Cu_3P$ phase.

(Partial Discharge Characteristics)

One hundred thermal cycles each consisting of 200° C. for 5 minutes-40° C. for 5 minutes were loaded on each of the obtained power module substrates. Then, probes were brought into contact with the surface of the circuit layer of the power module substrate and with the side, on which the circuit layer was not formed, of the ceramic substrate, and the power module substrate was dipped in Fluorinert manufactured by 3M. Then, under the conditions specified in the international standard IEC 61287, a quantity of electricity discharged was measured by setting a measurement voltage to be 3.3 kV so as to evaluate the partial discharge characteristics. The results evaluated at the measurement voltage are shown in Table 1.

TABLE 1

| | | Cu—P-based brazing material | | | | | Laminating step | Heat treatment step | | | Area ratio of Cu$_3$P phase | Partial discharge characteristics Quantity of electricity discharged |
|---|---|---|---|---|---|---|---|---|---|---|---|---|
| | | Component (mass %) | | | | Melting point | | Temperature | Time | Heating rate | | |
| | | P | Sn | Other elements | | Cu | °C. | [Ti/P] | °C. | min | °C./min | % | pC |
| Example of the present invention | 1-1 | 6.3 | 9.3 | Ni | 7 | Balance | 600 | 0.1 | 650 | 150 | 7 | 14.7 | 2.5 |
| | 1-2 | 6.3 | 9.3 | Ni | 7 | Balance | 600 | 0.8 | 650 | 150 | 7 | 2.1 | 0.7 |
| | 1-3 | 6.3 | 9.3 | Mn | 8 | Balance | 600 | 0.15 | 650 | 90 | 5 | 13.2 | 2.0 |
| | 1-4 | 7 | 15 | Fe | 5 | Balance | 580 | 0.7 | 600 | 90 | 30 | 1.5 | 0.7 |
| | 1-5 | 7 | 15 | Ni | 10 | Balance | 580 | 0.2 | 600 | 210 | 25 | 10.9 | 2.0 |
| | 1-6 | 7 | 15 | Ni | 10 | Balance | 580 | 0.2 | 630 | 210 | 25 | 9.8 | 1.8 |
| | 1-7 | 7 | 15 | Ni | 10 | Balance | 580 | 0.6 | 630 | 30 | 10 | 0.3 | 0.6 |
| | 1-8 | 6.3 | 9.3 | Ni | 7 | Balance | 600 | 0.6 | 650 | 30 | 10 | 0.4 | 0.8 |
| Comparative Example | 1-1 | 6.3 | 9.3 | Ni | 7 | Balance | 600 | 0.05 | 650 | 90 | 10 | 17.9 | 3.6 |
| | 1-2 | 6.3 | 9.3 | Ni | 7 | Balance | 600 | 1.2 | 650 | 90 | 10 | 16.2 | 4.2 |
| | 1-3 | 7 | 15 | Ni | 10 | Balance | 580 | 0.6 | 650 | 90 | 1 | 17.1 | 3.1 |
| | 1-4 | 7 | 15 | Ni | 10 | Balance | 580 | 0.6 | 650 | 90 | 50 | 15.6 | 4.0 |

In Comparative Example 1-1, the atomic ratio [Ti/P] of Ti to P interposed between the ceramic substrate and the Cu foil was less than 0.1, and the area ratio of the Cu$_3$P phase in the region extending by up to 50 µm toward the Cu foil side from the bonding surface of the ceramic substrate was higher than 15%. Therefore, the partial discharge characteristics were insufficient.

In Comparative Example 1-2, the atomic ratio [Ti/P] of Ti to P interposed between the ceramic substrate and the Cu foil was higher than 0.8, and the partial discharge characteristics were insufficient.

In Comparative Example 1-3, the heating rate at which the laminate reached the heating temperature in the heat treatment step was less than 5° C./min, and the area ratio of the Cu$_3$P phase in the region extending by up to 50 µm toward the Cu foil side from the bonding surface of the ceramic substrate was higher than 15%. Therefore, the partial discharge characteristics were insufficient.

In Comparative Example 1-4, the heating rate at which the laminate reached the heating temperature in the heat treatment step was higher than 30° C./min, and the partial discharge characteristics were insufficient.

In contrast, in all the Examples 1-1 to 1-8 of the present invention, the partial discharge characteristics were excellent. From Example 1, it was confirmed that in a case where the Cu foil is bonded to one surface of the ceramic substrate, the partial discharge characteristics can be improved.

Example 2

Next, the results of experiments (Example 2) performed to check the effects of the present invention will be described.

A Cu—P-based brazing material shown in Table 2, a Ti material, and a Cu foil (37 mm×37 mm×0.2 mmt) formed of oxygen-free copper were laminated in this order on one surface and the other surface of a ceramic substrate (40 mm×40 mm×0.635 mmt) formed of AlN.

At this time, the Cu—P-based brazing material and the Ti material were disposed such that an atomic ratio [Ti/P] of Ti to P interposed between the ceramic substrate and the Cu foil became the number described in Table 2.

As the ceramic substrate of the present example, a sintered ceramic substrate was used in which ZrO$_2$ was added in an amount of 10 mass % with respect to 100 mass % of AlN.

As the heat treatment step, the aforementioned laminate was put into a vacuum heating furnace in a state where a pressure of 15 kgf/cm$^2$ was applied thereto in the lamination direction, and heated to a temperature equal to or higher than the melting start temperature of the Cu—P-based brazing material so as to bond the Cu foil to one surface and the other surface of the ceramic substrate, thereby forming a circuit layer and a metal layer.

The heating temperature, the holding time at the heating temperature, and the heating rate at which the laminate reaches the heating temperature in the heat treatment step were set according to the conditions shown in Table 2.

In this way, power module substrates of Examples 2-1 to 2-8 of the present invention and Comparative Examples 2-1 to 2-4 were obtained.

The power module substrates obtained as above were evaluated in the same manner as that in Example 1 in terms of the area ratio of a Cu$_3$P phase in the vicinity of the ceramic substrate in the bonding layer between the ceramic substrate and the circuit layer and in terms of the partial discharge characteristics. At the time of evaluating the partial discharge characteristics, measurement was performed by bringing probes into contact with the circuit layer and the metal layer.

The evaluation results are shown in Table 2.

TABLE 2

| | | Cu—P-based brazing material | | | | | Heat treatment step | | | Area ratio of Cu$_3$P phase | Partial discharge characteristics Quantity of electricity discharged |
|---|---|---|---|---|---|---|---|---|---|---|---|
| | | Component (mass %) | | | | Melting point | Laminating step | Temperature | Time | Heating rate | |
| | | P | Sn | Other elements | Cu | °C. | [Ti/P] | °C. | min | °C./min | % | pC |
| Example of the present invention | 2-1 | 6.3 | 9.3 | Ni 7 | Balance | 600 | 0.1 | 650 | 60 | 8 | 14.8 | 4.8 |
| | 2-2 | 6.3 | 9.3 | Ni 7 | Balance | 600 | 0.8 | 650 | 60 | 8 | 3.8 | 1.3 |
| | 2-3 | 6.3 | 9.3 | Cr 8 | Balance | 600 | 0.4 | 650 | 120 | 5 | 1.9 | 2.2 |
| | 2-4 | 7 | 15 | Cr 5 | Balance | 580 | 0.4 | 620 | 120 | 30 | 2.3 | 2.3 |
| | 2-5 | 7 | 15 | Ni 10 | Balance | 580 | 0.7 | 620 | 240 | 20 | 1.8 | 1.3 |
| | 2-6 | 7 | 15 | Ni 10 | Balance | 580 | 0.7 | 640 | 240 | 20 | 1.2 | 1.3 |
| | 2-7 | 7 | 15 | Ni 10 | Balance | 580 | 0.3 | 640 | 240 | 15 | 5.8 | 2.9 |
| | 2-8 | 6.3 | 9.3 | Ni 7 | Balance | 600 | 0.3 | 640 | 240 | 15 | 6.3 | 3.0 |
| Comparative Example | 2-1 | 6.3 | 9.3 | Ni 7 | Balance | 600 | 0.05 | 640 | 240 | 15 | 16.4 | 6.1 |
| | 2-2 | 6.3 | 9.3 | Ni 7 | Balance | 600 | 1.2 | 640 | 240 | 15 | 15.6 | 8.5 |
| | 2-3 | 7 | 15 | Ni 10 | Balance | 580 | 0.5 | 640 | 240 | 1 | 16.4 | 6.9 |
| | 2-4 | 7 | 15 | Ni 10 | Balance | 580 | 0.5 | 640 | 240 | 50 | 15.8 | 10.1 |

In Comparative Example 2-1, the atomic ratio [Ti/P] of Ti to P interposed between the ceramic substrate and the Cu foil was less than 0.1, and the area ratio of the Cu$_3$P phase in the region extending by up to 50 μm toward the Cu foil side from the bonding surface of the ceramic substrate was higher than 15%. Therefore, the partial discharge characteristics were insufficient.

In Comparative Example 2-2, the atomic ratio [Ti/P] of Ti to P interposed between the ceramic substrate and the Cu foil was higher than 0.8, and the partial discharge characteristics were insufficient.

In Comparative Example 2-3, the heating rate at which the laminate reached the heating temperature in the heat treatment step was less than 5° C./min, and the area ratio of the Cu$_3$P phase in the region extending by up to 50 μm toward the Cu foil side from the bonding surface of the ceramic substrate was higher than 15%. Therefore, the partial discharge characteristics were insufficient.

In Comparative Example 2-4, the heating rate at which the laminate reached the heating temperature in the heat treatment step was higher than 30° C./min, and the partial discharge characteristics were insufficient.

In contrast, in all the Examples 2-1 to 2-8 of the present invention, the partial discharge characteristics were excellent. From Example 2, it was confirmed that even in a case where the Cu foil is bonded to both surfaces of the ceramic substrate, the partial discharge characteristics can be improved.

Example 3

Next, the results of experiments (Example 3) performed to check the effects of the present invention will be described.

A Cu—P-based brazing material shown in Table 3, a Ti material, and a Cu foil (37 mm×37 mm×0.2 mmt) formed of oxygen-free copper were laminated in this order on one surface of a ceramic substrate (40 mm×40 mm×0.635 mmt) formed of AlN. In addition, an Al sheet (37 mm×37 mm×2.1 mmt) formed of Al having a purity of 99.99 mass % was laminated on the other surface of the ceramic substrate through an Al—Si-based brazing material.

At this time, the Cu—P-based brazing material and the Ti material were disposed such that an atomic ratio [Ti/P] of Ti to P interposed between the ceramic substrate and the Cu foil became the number described in Table 3.

As the ceramic substrate of the present example, a sintered ceramic substrate was used in which ZrO$_2$ was added in an amount of 10 mass % with respect to 100 mass % of AlN.

As the heat treatment step, the aforementioned laminate was put into a vacuum heating furnace in a state where a pressure of 15 kgf/cm$^2$ was applied thereto in the lamination direction, and heated to a temperature equal to or higher than the melting start temperature of the Cu—P-based brazing material under a pressure equal to or higher than 10$^{-6}$ Pa and equal to or lower than 10$^{-3}$ Pa so as to form a circuit layer by bonding the Cu foil to one surface of the ceramic substrate and to form a metal layer by bonding the Al sheet on the other surface of the ceramic substrate.

The heating temperature, the holding time at the heating temperature, and the heating rate at which the laminate reaches the heating temperature in the heat treatment step were set according to the conditions shown in Table 3.

In this way, power module substrates of Examples 3-1 to 3-8 of the present invention and Comparative Examples 3-1 to 3-4 were obtained.

The power module substrates obtained as above were evaluated in the same manner as that in Example 1 in terms of the area ratio of a Cu$_3$P phase in the vicinity of the ceramic substrate in the bonding layer between the ceramic substrate and the circuit layer and in terms of the partial discharge characteristics. At the time of evaluating the partial discharge characteristics, measurement was performed by bringing probes into contact with the circuit layer and the metal layer.

The evaluation results are shown in Table 3.

TABLE 3

| | | Cu—P-based brazing material | | | | | Heat treatment step | | | Area ratio of Cu$_3$P phase | Partial discharge characteristics Quantity of electricity discharged |
|---|---|---|---|---|---|---|---|---|---|---|---|
| | | Component (mass %) | | | | Melting point | Laminating step | Temperature | Time | Heating rate | |
| | | P | Sn | Other elements | | Cu | ° C. | [Ti/P] | ° C. | min | ° C./min | % | pC |
| Example of the present invention | 3-1 | 6.3 | 9.3 | Ni | 7 | Balance | 600 | 0.1 | 640 | 120 | 7 | 14.5 | 3.5 |
| | 3-2 | 6.3 | 9.3 | Ni | 7 | Balance | 600 | 0.8 | 640 | 120 | 7 | 1.8 | 1.0 |
| | 3-3 | 6.3 | 9.3 | Fe | 8 | Balance | 600 | 0.15 | 640 | 90 | 5 | 13.0 | 3.1 |
| | 3-4 | 7 | 15 | Mn | 3 | Balance | 580 | 0.15 | 650 | 90 | 30 | 13.2 | 3.1 |
| | 3-5 | 7 | 15 | Ni | 10 | Balance | 580 | 0.4 | 650 | 180 | 15 | 3.0 | 1.7 |
| | 3-6 | 7 | 15 | Ni | 10 | Balance | 580 | 0.4 | 650 | 180 | 20 | 4.7 | 1.7 |
| | 3-7 | 7 | 15 | Ni | 10 | Balance | 580 | 0.2 | 650 | 60 | 20 | 11.2 | 2.8 |
| | 3-8 | 6.3 | 9.3 | Ni | 7 | Balance | 600 | 0.2 | 650 | 60 | 20 | 9.9 | 2.7 |
| Comparative Example | 3-1 | 6.3 | 9.3 | Ni | 7 | Balance | 600 | 0.05 | 650 | 60 | 20 | 16.8 | 4.3 |
| | 3-2 | 6.3 | 9.3 | Ni | 7 | Balance | 600 | 1.2 | 650 | 60 | 20 | 16.0 | 5.1 |
| | 3-3 | 7 | 15 | Ni | 10 | Balance | 580 | 0.7 | 650 | 60 | 1 | 18.4 | 4.9 |
| | 3-4 | 7 | 15 | Ni | 10 | Balance | 580 | 0.7 | 650 | 60 | 50 | 15.7 | 4.6 |

In Comparative Example 3-1, the atomic ratio [Ti/P] of Ti to P interposed between the ceramic substrate and the Cu foil was less than 0.1, and the area ratio of the Cu$_3$P phase in the region extending by up to 50 μm toward the Cu foil side from the bonding surface of the ceramic substrate was higher than 15%. Therefore, the partial discharge characteristics were insufficient.

In Comparative Example 3-2, the atomic ratio [Ti/P] of Ti to P interposed between the ceramic substrate and the Cu foil was higher than 0.8, and the partial discharge characteristics were insufficient.

In Comparative Example 3-3, the heating rate at which the laminate reached the heating temperature in the heat treatment step was less than 5° C./min, and the area ratio of the Cu$_3$P phase in the region extending by up to 50 μm toward the Cu foil side from the bonding surface of the ceramic substrate was higher than 15%. Therefore, the partial discharge characteristics were insufficient.

In Comparative Example 3-4, the heating rate at which the laminate reached the heating temperature in the heat treatment step was higher than 30° C./min, and the partial discharge characteristics were insufficient.

In contrast, in all the Examples 3-1 to 3-8 of the present invention, the partial discharge characteristics were excellent. From Example 3, it was confirmed that even in a case where the Cu foil is bonded to one surface of the ceramic substrate and the Al sheet is bonded to the other surface of the ceramic substrate, the partial discharge characteristics can be improved.

Example 4

Next, the results of experiments (Example 4) performed to check the effects of the present invention will be described.

A Cu—P-based brazing material shown in Table 4, a Ti material, and a Cu foil (37 mm×37 mm×0.2 mmt) formed of oxygen-free copper were laminated in this order on one surface and the other surface of a ceramic substrate (40 mm×40 mm×1.0 mmt) formed of AlN.

At this time, the Cu—P-based brazing material and the Ti material were disposed such that an atomic ratio [Ti/P] of Ti to P interposed between the ceramic substrate and the Cu foil became the number described in Table 4.

As the ceramic substrate of the present example, a sintered ceramic substrate was used in which ZrO$_2$ was added in an amount of 10 mass % with respect to 100 mass % of AlN.

As the heat treatment step, the aforementioned laminate was put into a vacuum heating furnace in a state where a pressure of 15 kgf/cm$^2$ was applied thereto in the lamination direction, and heated to a temperature equal to or higher than the melting start temperature of the Cu—P-based brazing material so as to bond the Cu foil to one surface and the other surface of the ceramic substrate, thereby forming a circuit layer and a metal layer.

The heating temperature, the holding time at the heating temperature, and the heating rate at which the laminate reaches the heating temperature in the heat treatment step were set according to the conditions shown in Table 4.

In this way, power module substrates of Examples 4-1 to 4-8 of the present invention and Comparative Examples 4-1 to 4-4 were obtained.

The power module substrates obtained as above were evaluated in the same manner as that in Example 1 in terms of the area ratio of a Cu$_3$P phase in the vicinity of the ceramic substrate in the bonding layer between the ceramic substrate and the circuit layer.

For the partial discharge characteristics, first, 200 thermal cycles each consisting of 150° C. for 15 minutes-50° C. for 15 minutes were loaded on each of the obtained power module substrates. Then, probes were brought into contact with the surface of the circuit layer and the surface of the metal layer in the power module substrate, and the power module substrate was dipped in Fluorinert. Then, under the conditions specified in the international standard IEC 61287, a quantity of electricity discharged was measured by setting a measurement voltage to be 5.1 kV so as to evaluate the partial discharge characteristics. That is, in Example 4, the partial discharge characteristics at the time of loading a high voltage were evaluated.

The evaluation results are shown in Table 4.

TABLE 4

| | | Cu—P-based brazing material | | | | | Laminating step | Heat treatment step | | | Area ratio of Cu$_3$P phase | Partial discharge characteristics Quantity of electricity discharged |
|---|---|---|---|---|---|---|---|---|---|---|---|---|
| | | Component (mass %) | | | | Melting point | | Temperature | Time | Heating rate | | |
| | | P | Sn | Other elements | | Cu | °C. | [Ti/P] | °C. | min | °C./min | % | pC |
| Example of the present invention | 4-1 | 6.3 | 9.3 | Ni | 7 | Balance | 600 | 0.1 | 650 | 60 | 8 | 14.7 | 9.7 |
| | 4-2 | 6.3 | 9.3 | Ni | 7 | Balance | 600 | 0.8 | 650 | 60 | 8 | 3.7 | 5.5 |
| | 4-3 | 6.3 | 9.3 | Cr | 8 | Balance | 600 | 0.4 | 650 | 120 | 5 | 2.0 | 4.0 |
| | 4-4 | 7 | 15 | Cr | 5 | Balance | 580 | 0.4 | 620 | 120 | 30 | 2.3 | 5.7 |
| | 4-5 | 7 | 15 | Ni | 10 | Balance | 580 | 0.7 | 620 | 240 | 20 | 1.8 | 5.2 |
| | 4-6 | 7 | 15 | Ni | 10 | Balance | 580 | 0.7 | 640 | 240 | 20 | 1.3 | 4.7 |
| | 4-7 | 7 | 15 | Ni | 10 | Balance | 580 | 0.3 | 640 | 240 | 15 | 5.6 | 3.9 |
| | 4-8 | 6.3 | 9.3 | Ni | 7 | Balance | 600 | 0.3 | 640 | 240 | 15 | 6.2 | 4.2 |
| Comparative Example | 4-1 | 6.3 | 9.3 | Ni | 7 | Balance | 600 | 0.05 | 640 | 240 | 15 | 16.2 | 19.3 |
| | 4-2 | 6.3 | 9.3 | Ni | 7 | Balance | 600 | 1.2 | 640 | 240 | 15 | 15.9 | 17.1 |
| | 4-3 | 7 | 15 | Ni | 10 | Balance | 580 | 0.5 | 640 | 240 | 1 | 15.9 | 18.5 |
| | 4-4 | 7 | 15 | Ni | 10 | Balance | 580 | 0.5 | 640 | 240 | 50 | 16.6 | 18.4 |

In Comparative Example 4-1, the atomic ratio [Ti/P] of Ti to P interposed between the ceramic substrate and the Cu foil was less than 0.1, and the area ratio of the Cu$_3$P phase in the region extending by up to 50 μm toward the Cu foil side from the bonding surface of the ceramic substrate was higher than 15%. Therefore, the partial discharge characteristics were insufficient.

In Comparative Example 4-2, the atomic ratio [Ti/P] of Ti to P interposed between the ceramic substrate and the Cu foil was higher than 0.8, and the partial discharge characteristics were insufficient.

In Comparative Example 4-3, the heating rate at which the laminate reached the heating temperature in the heat treatment step was less than 5° C./min, and the area ratio of the Cu$_3$P phase in the region extending by up to 50 μm toward the Cu foil side from the bonding surface of the ceramic substrate was higher than 15%. Therefore, the partial discharge characteristics were insufficient.

In Comparative Example 4-4, the heating rate at which the laminate reached the heating temperature in the heat treatment step was higher than 30° C./min, and the partial discharge characteristics were insufficient.

In contrast, in all the Examples 4-1 to 4-8 of the present invention, the partial discharge characteristics were excellent. From Example 4, it was confirmed that even in a case where the measurement voltage is set to be high such as 5.1 Kv, sufficient partial discharge characteristics can be obtained.

Example 5

Next, the results of experiments (Example 5) performed to check the effects of the present invention will be described.

A Cu—P-based brazing material shown in Table 5, a Ti material, and a Cu foil (37 mm×37 mm×0.2 mmt) formed of oxygen-free copper were laminated in this order on one surface and the other surface of a ceramic substrate (40 mm×40 mm×0.32 mmt) formed of Si$_3$N$_4$.

At this time, the Cu—P-based brazing material and the Ti material were disposed such that an atomic ratio [Ti/P] of Ti to P interposed between the ceramic substrate and the Cu foil became the number described in Table 5.

As the heat treatment step, the aforementioned laminate was put into a vacuum heating furnace in a state where a pressure of 15 kgf/cm$^2$ was applied thereto in the lamination direction, and heated to a temperature equal to or higher than the melting start temperature of the Cu—P-based brazing material so as to bond the Cu foil to one surface and the other surface of the ceramic substrate, thereby forming a circuit layer and a metal layer.

The heating temperature, the holding time at the heating temperature, and the heating rate at which the laminate reaches the heating temperature in the heat treatment step were set according to the conditions shown in Table 5.

In this way, power module substrates of Examples 5-1 to 5-8 of the present invention and Comparative Examples 5-1 to 5-4 were obtained.

The power module substrates obtained as above were evaluated in the same manner as that in Example 1 in terms of the area ratio of a Cu$_3$P phase in the vicinity of the ceramic substrate in the bonding layer between the ceramic substrate and the circuit layer and in terms of the partial discharge characteristics. At the time of evaluating the partial discharge characteristics, measurement was performed by bringing probes into contact with the circuit layer and the metal layer.

The evaluation results are shown in Table 5.

TABLE 5

| | | colspan="5" | Cu—P-based brazing material | | | | Laminating step | colspan="3" | Heat treatment step | | Area ratio of Cu₃P phase | Partial discharge characteristics Quantity of electricity discharged |
|---|---|---|---|---|---|---|---|---|---|---|---|---|
| | | colspan="3" | Component (mass %) | | Melting point | | | Temperature | Time | Heating rate | | |
| | | P | Sn | Other elements | | Cu | ° C. | [Ti/P] | ° C. | min | ° C./min | % | pC |
| Example of the present invention | 5-1 | 6.3 | 9.3 | Ni | 7 | Balance | 600 | 0.1 | 640 | 120 | 7 | 14.3 | 9.8 |
| | 5-2 | 6.3 | 9.3 | Ni | 7 | Balance | 600 | 0.8 | 640 | 120 | 7 | 0.0 | 1.8 |
| | 5-3 | 6.3 | 9.3 | Cr | 5 | Balance | 600 | 0.15 | 640 | 90 | 5 | 13.2 | 9.1 |
| | 5-4 | 7 | 15 | Mn | 3 | Balance | 580 | 0.15 | 650 | 90 | 30 | 13.6 | 8.6 |
| | 5-5 | 7 | 15 | Ni | 10 | Balance | 580 | 0.4 | 650 | 180 | 15 | 6.8 | 5.2 |
| | 5-6 | 7 | 15 | Ni | 10 | Balance | 580 | 0.4 | 650 | 180 | 15 | 6.4 | 4.3 |
| | 5-7 | 7 | 15 | Ni | 10 | Balance | 580 | 0.2 | 650 | 60 | 20 | 11.2 | 7.6 |
| | 5-8 | 6.3 | 9.3 | Ni | 7 | Balance | 600 | 0.2 | 650 | 60 | 20 | 12.7 | 8.2 |
| Comparative Example | 5-1 | 6.3 | 9.3 | Ni | 7 | Balance | 600 | 0.05 | 650 | 60 | 20 | 17.1 | 12.4 |
| | 5-2 | 6.3 | 9.3 | Ni | 7 | Balance | 600 | 1.2 | 650 | 60 | 20 | 0.0 | 10.9 |
| | 5-3 | 7 | 15 | Ni | 10 | Balance | 580 | 0.7 | 650 | 60 | 1 | 18.2 | 12.0 |
| | 5-4 | 7 | 15 | Ni | 10 | Balance | 580 | 0.7 | 650 | 60 | 50 | 0.2 | 10.1 |

In Comparative Example 5-1, the atomic ratio [Ti/P] of Ti to P interposed between the ceramic substrate and the Cu foil was less than 0.1, and the area ratio of the Cu₃P phase in the region extending by up to 50 μm toward the Cu foil side from the bonding surface of the ceramic substrate was higher than 15%. Therefore, the partial discharge characteristics were insufficient.

In Comparative Example 5-2, the atomic ratio [Ti/P] of Ti to P interposed between the ceramic substrate and the Cu foil was higher than 0.8, and the partial discharge characteristics were insufficient.

In Comparative Example 5-3, the heating rate at which the laminate reached the heating temperature in the heat treatment step was less than 5° C./min, and the area ratio of the Cu₃P phase in the region extending by up to 50 μm toward the Cu foil side from the bonding surface of the ceramic substrate was higher than 15%. Therefore, the partial discharge characteristics were insufficient.

In Comparative Example 5-4, the heating rate at which the laminate reached the heating temperature in the heat treatment step was higher than 30° C./min, and the partial discharge characteristics were insufficient.

In contrast, in all the Examples 5-1 to 5-8 of the present invention, the partial discharge characteristics were excellent. From Example 5, it was confirmed that even in a case where the Cu foil is bonded to both surfaces of the ceramic substrate formed of $Si_3N_4$, the partial discharge characteristics can be improved.

INDUSTRIAL APPLICABILITY

According to the bonded body, the power module substrate formed of the bonded body, the power module, the method for manufacturing the bonded body, and the method for manufacturing a power module substrate of the present invention, the ceramic member and the Cu member can be excellently bonded to each other, and the occurrence of partial discharge can be inhibited even in a case where a thermal cycle reaching a relatively high temperature is loaded.

REFERENCE SIGNS LIST 10, 110, 210: Power module substrate (bonded body)
11: Ceramic substrate (ceramic member)
12, 112, 212: Circuit layer (Cu member)
16: $Cu_3P$ phase
18, 118, 218: Bonding layer
22, 122, 123, 222: Cu foil (Cu member)
24, 124, 224: Cu—P-based brazing material
113: Metal layer (Cu member)

The invention claimed is:

1. A bonded body comprising:
a ceramic member formed of ceramics;
a Cu member formed of Cu or a Cu alloy; and
a bonding layer formed between the ceramic member and the Cu member;
   wherein the bonding layer comprises a Cu—Sn layer, a Ti-containing layer, and a $Cu_3P$ phase,
   wherein:
      the Cu—Sn layer is formed on a bonding surface of the ceramic member, the Ti-containing layer is formed between the Cu—Sn layer and the Cu member, and
      the $Cu_3P$ phase is dispersed in the Cu—Sn layer; and
   wherein, in the bonding layer, an area ratio of the $Cu_3P$ phase, in a region extending by up to 50 μm toward the Cu member from the bonding surface of the ceramic member, is from 0.3% to 15%, and
   wherein the Cu—Sn layer is a layer in which Sn forms a solid solution in Cu.

2. A power module substrate which is the bonded body according to claim 1, the power module substrate comprising:
a ceramic substrate formed of the ceramic member; and
a circuit layer which is formed on one surface of the ceramic substrate and formed of the Cu member.

3. The power module substrate according to claim 2, wherein a metal layer formed of Al or an Al alloy is formed on the other surface of the ceramic substrate.

4. A power module substrate which is the bonded body according to claim 1, the power module substrate comprising:
a ceramic substrate formed of the ceramic member;
a circuit layer formed on one surface of the ceramic substrate; and
a metal layer which is formed on the other surface of the ceramic substrate and formed of the Cu member, wherein in a bonding layer formed between the ceramic substrate and the metal layer, an area ratio of a $Cu_3P$ phase in a region extending by up to 50 μm toward the metal layer side from a bonding surface of the ceramic substrate is equal to or lower than 15%.

5. A power module comprising:

the power module substrate according to claim 2; and a semiconductor element mounted on the circuit layer of the power module substrate.

\* \* \* \* \*